United States Patent
Martin et al.

(10) Patent No.: US 10,990,714 B2
(45) Date of Patent: Apr. 27, 2021

(54) APPARATUS AND METHOD FOR SAFETY ANALYSIS EVALUATION WITH DATA-DRIVEN WORKFLOW

(71) Applicant: BWXT mPower, Inc., Charlotte, NC (US)

(72) Inventors: Robert P. Martin, Lynchburg, VA (US); Simone H. Morgan, Lynchburg, VA (US)

(73) Assignee: BWXT mPower, Inc., Charlotte, NC (US)

( * ) Notice: Subject to any disclaimer, the term of this patent is extended or adjusted under 35 U.S.C. 154(b) by 468 days.

(21) Appl. No.: 14/978,931

(22) Filed: Dec. 22, 2015

(65) Prior Publication Data

US 2017/0177756 A1    Jun. 22, 2017

(51) Int. Cl.
*G06F 17/50*        (2006.01)
*G06F 30/20*        (2020.01)

(52) U.S. Cl.
CPC .................................. *G06F 30/20* (2020.01)

(58) Field of Classification Search
CPC .................................................. G06F 17/5018
USPC .................................................... 703/2
See application file for complete search history.

(56) References Cited

U.S. PATENT DOCUMENTS

| 5,619,433 | A  | 4/1997  | Wang et al.     |
| 6,785,633 | B2 | 8/2004  | Patanian et al. |
| 7,480,536 | B2 | 1/2009  | Kaufman et al.  |
| 8,983,810 | B2 | 3/2015  | Takeuchi et al. |
| 9,208,911 | B2 | 12/2015 | Frepoli et al.  |
| 2004/0086071 | A1 * | 5/2004 | Lee .......................... G21C 17/00 376/259 |

(Continued)

FOREIGN PATENT DOCUMENTS

| EP | 1936637 A1 | 6/2008 |
| EP | 2643781 B1 | 10/2013 |

(Continued)

OTHER PUBLICATIONS

Martin, Robert P., et al., AREVA's Realistic Large Break LOCA Analysis Methodology, Elsevier Nuclear Engineering and Design, accepted Feb. 28, 2005, pp. 1713-1725, vol. 235 (2005), Elsevier, all enclosed pages cited.

(Continued)

*Primary Examiner* — Andy Ho

(74) *Attorney, Agent, or Firm* — Nelson Mullins Riley & Scarborough LLP

(57) ABSTRACT

An apparatus and method for system safety analysis evaluation is provided, the apparatus including processing circuitry configured for generating a calculation matrix for a system, generating a plurality of models based on the calculation matrix, performing a benchmarking or convolution analysis of the plurality of models, identifying a design envelope based on the benchmarking or convolution analysis, deriving uncertainty models from the benchmarking or convolution analysis, deriving an assessment judgment based on the uncertainty models and acceptance criteria, defining one or more limiting scenarios based on the design envelope, and determining a safety margin in at least one figure-of-merit for the system based on the design envelope and the acceptance criteria.

20 Claims, 10 Drawing Sheets

(56) References Cited

U.S. PATENT DOCUMENTS

| | | |
|---|---|---|
| 2008/0288121 A1 | 11/2008 | Fedosovskiy et al. |
| 2013/0156142 A1 | 6/2013 | Yodo |
| 2014/0324520 A1* | 10/2014 | Fedosovskiy ...... G06Q 10/0635 |
| | | 705/7.28 |

FOREIGN PATENT DOCUMENTS

| | | |
|---|---|---|
| JP | 2004341814 | 12/2004 |
| WO | 2003/005376 A1 | 1/2003 |
| WO | 2003/098640 A2 | 11/2003 |
| WO | WO2006123971 | 11/2006 |

OTHER PUBLICATIONS

Abdelghany, Jamal M., et al., Uncertainty Analysis for Containment Response of U.S. EPR™ Reactor to Large Break Loss-of-Coolant Accidents, Proceedings of ICAPP '10, Jun. 12-17, 2010, paper 10131, San Diego, California, all enclosed pages cited.

Martin, Robert P., et al., Perspectives on the Application of Order-Statistics in Best-Estimate Plus Uncertainty Nuclear Safety Analysis, Elsevier Nuclear Engineering and Design, accepted Oct. 19, 2010, pp. 274-284, vol. 241 (2011), Elsevier, all enclosed pages cited.

Martin, Robert P., Quantifying Phenomenological Importance in Best-Estimate Plus Uncertainty Analyses, Nuclear Technology, Sep. 2011, pp. 652-662, vol. 175, Nuclear Technology, all enclosed pages cited.

Martin, Robert P., An Evaluation Methodology Development and Application Process for Severe Accident Safety Issue Resolution, Science and Technology of Nuclear Installations, accepted Feb. 8, 2012, pp. 1-13, vol. 2012, Article ID 735719, Hindawi Publishing Corporation, all enclosed pages cited.

Morgan, Simone H., RelapManager—A B&W mPower Safety Analysis Tool, 2013 International RELAP5-3D Users Group Meeting, 2013, pp. 1-25, Idaho National Laboratory, all enclosed pages cited.

International Preliminary Report on Patentability, PCT/US2016/065709, dated Jun. 26, 2018, 6 pages.

International Search Report and Written Opinion, PCT/US2016/065709, dated Feb. 17, 2017, 7 pages.

U.S. Nuclear Regulatory Commission, Office of Nuclear Regulatory Research, Regulatory Guide 1.203, Dec. 2005.

Extended Search Report dated Jul. 30, 2019, for corresponding European application No. 16879874.2.

Theofanous, T. G. (Editor) (1992). Preface to the discussion on quantifying reactor safety margins (pp. 405-447), Nuclear Engineering and Design, vol. 132, No. 3, p. 403.

Theofanous, T. G. (Editor) (1990). Preface, Nuclear Engineering and Design, vol. 119, No. 1, p. ix.

Liles, D. R and Mahaffy, J. H (1986). TRAC-PF1/MOD1: an advanced best-estimate computer program for pressurized water reactor thermal-hydraulic analysis, NUREG/CR-3858; LA-10157-MS (Los Alamos National Laboratory).

Thurgood, M. J., Kelly, J. M., Guidotti, T. E., Kohrt, R. J. and Crowell, K. R. (1983). COBRA/TRAC—a thermal hydraulics code for transient analysis of nuclear reactor vessels and primary coolant systems, NUREG/CR-3046, PNL-4385 (Pacific Northwest National Laboratory).

USNRC (2005a). Transient and accident analysis methods, Regulatory Guide 1.203.

USNRC (1989). Best Estimate Calculations of Emergency Core Cooling System Performance, Regulatory Guide 1.157.

Weaver, W. L., Tomlinson E. T. and Aumiller, D. L. (2001). An Executive Program for Use With RELAP5-3D, 2001 RELAP5 Users Seminar, Sun Valley, Idaho (USA).

Young, M. Y., Bajorek, S. M., Nissley, M. E., and Hochrieter, L. E. (1998). Application of code scaling applicability and uncertainty methodology to the large break loss of coolant, Nucl. Eng. Des., 186(1-2), pp. 39-52.

Wilson, G. E., et al. (1992). TPG response to the foregoing letters-to-the-editor, Nuclear Engineering and Design, vol. 132, No. 3, pp. 431-436.

Wilks, S. S. (1941). Determination of sample sizes for setting tolerance limits, Annuals of Mathematical Statistics, vol. 12, pp. 91-96.

Wilson, G. E. and Boyack, B. E. (1998). The role of the PIRT process in experiments, code development and code applications associated with reactor safety analysis, Nucl. Eng. Des., 186 (23), pp. 23-37.

Wilks, S.S., "Statistical prediction with special reference to the problem of tolerance limits," Annuals of Mathematical Statistics, 13, 400-409, 1942.

K. R. Greene et al. "Utilizing Elements of the CSAU Phenomena Identification and Ranking Table (PIRT) to Qualify a PWR Non-LOCA Transients Systems Code," Proc. 9th Int. Conf. Nuclear Engineering, Nice, France, 2001.

K. E. Carlson, "PWR Small Break LOCA Evaluation Model," EMF-2328(NP), Siemens Power Corporation, 2000.

USNRC (1980). Safety Evaluation for the Qualification of the One-Dimensional Core Transient Model for Boiling Water Reactors, NEDO24154P, vol. 1, II, and III, Memo from, NRC to T. Novak, Assistant Director for Operating Reactors.

USNRC (1988). Compendium of ECCS research for realistic LOCA analysis, NUREG/CR-1230.

USNRC (2000). ECCS evaluation models, 10 CFR 50 Appendix K.

Wickett, T., et al. (1998). Report of the Uncertainty Methods Study for Advanced Best Estimate Thermal Hydraulic Code Applications, NEA/CSNI R(97)35, vol. 1 and 2 (Organization for Economic Cooperation and Development).

Liles, D. R., "TRAC-PD2: advanced best-estimate computer program for pressurized water reactor loss-of-coolant accident analysis," NUREG/CR-2054, LA-8709-MS, Los Alamos National Laboratory, 426 pages (1981).

Thurgood, M. J., et al., COBRA-TF development, Proceedings of the 8th Water Reactor Safety Information Meeting, 16 pages (1980).

Sarikaya, B. et al., "TRACG statistical method for BWR loss-of-coolant accident analyses," Proc. of 2008 International Congress on Advances in Nuclear Power Plants (Anaheim, CA, USA) 4 pages (2008).

Pappone, D. C. (Oct. 2001). Presentation: SAFER/GESTR LOCA Analysis Process Seminar.

USNRC (1983). Information Report from William J. Dircks to the Commissioners, "Emergency Core Cooling System Analysis Methods," SECY-83-472.

USNRC (1988). Emergency core cooling systems, revisions to acceptance criteria, Federal Register 53-35996, 180.

Japanese Office Action dated Jan. 26, 2021, for corresponding Japanese application No. 2018-532603.

* cited by examiner

APPARATUS AND METHOD FOR SAFETY ANALYSIS EVALUATION WITH DATA-DRIVEN WORKFLOW

TECHNICAL FIELD

This invention was made with Government support under Contract No. DE-NE0000583 awarded by the Department of Energy. The Government has certain rights in this invention.

BACKGROUND

The federal regulatory review of engineered systems is principally concerned with all aspects important to public safety. Engineered systems rely on a unique organization of known phenomena, such as thermodynamics, hydrodynamics, turbine physics, or the like, working in concert to perform a specialized function, such as generating electricity from steam, perhaps heated by a nuclear reactor. Characterization of how particular phenomena influence the environment, measured in relative terms with respect to one or more figures-of-merit, is a valued knowledge component used by engineers and regulators in deliberations examining the merits of advancing a new technology. A figure-of-merit is a characterization of the performance of a system, relative to alternative systems. The demonstration of design safety relies on a combination of physical testing and analysis. While testing is generally favored over analysis, reliance on analysis typically increases with the complexity of the technology, such as nuclear reactor engineering, construction and operation. In some instances, physical testing may be too cost prohibitive to perform, restricting the testing to analysis. Further, public safety demands a formal process that seeks to eliminate subjectivity in such analyses.

The complexity and unique phenomenological condition of nuclear power plants is reflected in the dedicated attention of the federal regulatory authority, the U.S. Nuclear Regulatory Commission (NRC). Requirements and guidelines drafted by the NRC take the form of evaluation methodology frameworks designed to quantify acceptablility through standards and explicit criteria. Applicants seeking permission to advance new products for the nuclear industry are expected to demonstrate both the integrity of the nuclear power plant end-product and the evaluation methodologies that support the conclusion.

Among the principal evaluation methodology framework documents addressing nuclear power plant safety is Regulatory Guide 1.203, Transient and Accident Analysis Methods. Regulatory Guide 1.203 describes evaluation model features considered acceptable for analyzing transient and accident behavior within the design basis of a nuclear power plant. The evaluation model may be a particular collection of design and operational data, event-specific data, numerical models, analysis software, calculations, post-processing, or the like used to calculate the system behavior and estimate safety margins. The RG 1.203 framework may be a particular embodiment of the classic scientific method. As such, this evaluation model framework may be applicable in other safety analysis settings, which may be required in other regulated industries, including airline, food and drug, or automobile. Some embodiments may also apply outside of physical safety analysis, which may include the finance industry, as an example.

Characterization of uncertainties and biases are derived from the evaluation model verification and validation (i.e., an adequacy demonstration), which are considered in the quantification of safety margins. Different evaluation models derive different safety margin estimates. Generally, evaluation models revealing large safety margins have greater potential for cost effective application; however, evaluation models revealing small safety margin may be more cost effective to develop. Evaluation models employed in the nuclear industry may be understood as "state machine" workflows where several decision points of how to proceed are made outside the workflow. Generally, in these evaluation models results from one simulation may suggest a particular action; results from many simulations may suggest many actions.

An alternative class of evaluation models employs a data-driven workflow. Such evaluation models apply logical rules to datasets from many simulations to both defer user action and limit options.

The range of applicability for the evaluation model is in part determined by the physics and the models contained within the software. The adequacy of the evaluation model is demonstrated through a verification and validation exercise, whose outcome is a confirmation that the software's physics models can effectively represent the association between the key phenomena and safety figure(s)-of-merit over the entire range of conditions encompassed by the design envelope. Successful verification and validation is achieved if an adequate set of high-fidelity data and/or exact analytical solution set are identified, executed with the analysis software, and found to meet the defined acceptance criteria.

Safety analysis addresses the design and performance of safety-related structures, systems, and components (SSCs) and their adequacy for the prevention of accidents and mitigation of the consequences of accidents. The foundation of the evaluation model relies on the organization of design inputs and the subsequent analytical modeling describing the geometry of SSCs and transport characteristics of materials contained within SSCs. As noted in Section B of RG 1.203, in the case of nuclear power, the evaluation model includes the "procedures for treating the input and output information (particularly the code input arising from the plant geometry and the assumed plant state at transient initiation)". The result of this process establishes design specifications and an operational envelope. For safety analysis, the compilation of this information appears as the set of critical analytical model parameters and monitored outputs, including tolerances and uncertainties. Examples of major safety-related SSCs, in nuclear power applications, whose parameters characterize phenomena and/or processes relevant to safety analysis may include:

fuel, fuel elements, and assemblies
reactor core configuration
reactivity and reactivity control systems
reactor coolant systems and connected systems
non-safety systems supporting RCS heat removal
containment systems or means of confinement, including ventilation
fuel handling and storage of fresh and spent fuel A principal objective of system safety analysis is to confirm that a design's safety-related SSCs meet certain performance objectives through the use of specialized computer codes. A secondary objective is to evaluate and identify the analytical margins that will promote safety during design-basis and beyond design-basis events. As such, before safety analyses can be performed, design-related model parameters and essential operational setpoints must be identified.

Design and operational inputs, as referred to as analytical inputs or SSC inputs, to support modeling and analysis may be received and entered into computer models to evaluate the thermal hydraulic effects of key parameters and phenomena on safety measures using simulation engine codes, such as RELAP5-3D.

The analysis of the structures, systems and component combinations and variations or uncertainties is a complex and time intensive process requiring a large computational capacity. The volume or calculations may, in some instances, be mitigated or reduced using less preferred subjective qualitative assessments.

BRIEF SUMMARY OF SOME EXAMPLES

Accordingly, some example embodiments may enable system safety analysis evaluation, as described below. In one example embodiment, an apparatus is provided for system safety analysis evaluation including processing circuitry configured for generating a calculation matrix for a system safety analysis, generating a plurality of models based on the calculation matrix, performing a benchmarking or convolution analysis of the plurality of models, identifying a design envelope based on the benchmarking or convolution analysis, deriving one or more uncertainty model based on the benchmarking or convolution analysis, deriving an assessment judgment based on the design envelope and an acceptance criteria, and determining a safety margin in at least one figure-of-merit for the system based on the design envelope and the acceptance criteria. In another example embodiment, an apparatus for system safety analysis evaluation is provided including processing circuitry configured for generating a calculation matrix defining nominal values and uncertainty values for a nuclear reactor system, generating a plurality of models, each based on the calculation matrix and include a sample sets of the nominal values and trial values, performing a benchmarking or convolution analysis of the plurality of models that defines a correlation between a model parameter and a figure of merit, identifying a design envelope based on the benchmarking or convolution analysis that comprises a set of figure-of-merit values correlated to the nuclear reactor system operation, deriving one or more uncertainty model from the benchmarking or convolution analysis, deriving an assessment judgment based on the design envelope and an acceptance criteria, defining one or more limiting scenarios based on the design envelope, and determining a safety margin in at least one figure-of-merit for the nuclear reactor system based on the design envelope, one or more limiting scenarios, and the acceptance criteria. The at least one figure-of-merit is used to measure the safety margin of the nuclear reactor system In yet a further example embodiment, a method for system safety analysis evaluation is provided including generating a calculation matrix for a system safety analysis, generating a plurality of models based on the calculation matrix, performing a benchmarking or convolution analysis of the plurality of models, identifying a design envelope based on the benchmarking or convolution analysis, deriving one or more uncertainty models from the benchmarking or convolution analysis, deriving an assessment judgment based on the design envelope and an acceptance criteria, defining one or more limiting scenarios based on the design envelope, and determining a safety margin at least one figure-of-merit for the system based on the design envelope the one or more limiting scenarios, and the acceptance criteria.

In an example embodiment utilizing benchmarking analysis, a user determines the acceptability of the simulation software based on the design envelope and acceptance criteria. Additionally or alternatively, in an example embodiment utilizing convolution analysis, a user may independently verify the limiting scenarios. These independent verifications may be referred to as Analysis of Record.

BRIEF DESCRIPTION OF THE SEVERAL VIEWS OF THE DRAWING(S)

Having thus described the system safety analysis evaluation in general terms, reference will now be made to the accompanying drawings, which are not necessarily drawn to scale, and wherein:

DETAILED DESCRIPTION

Figure 1:
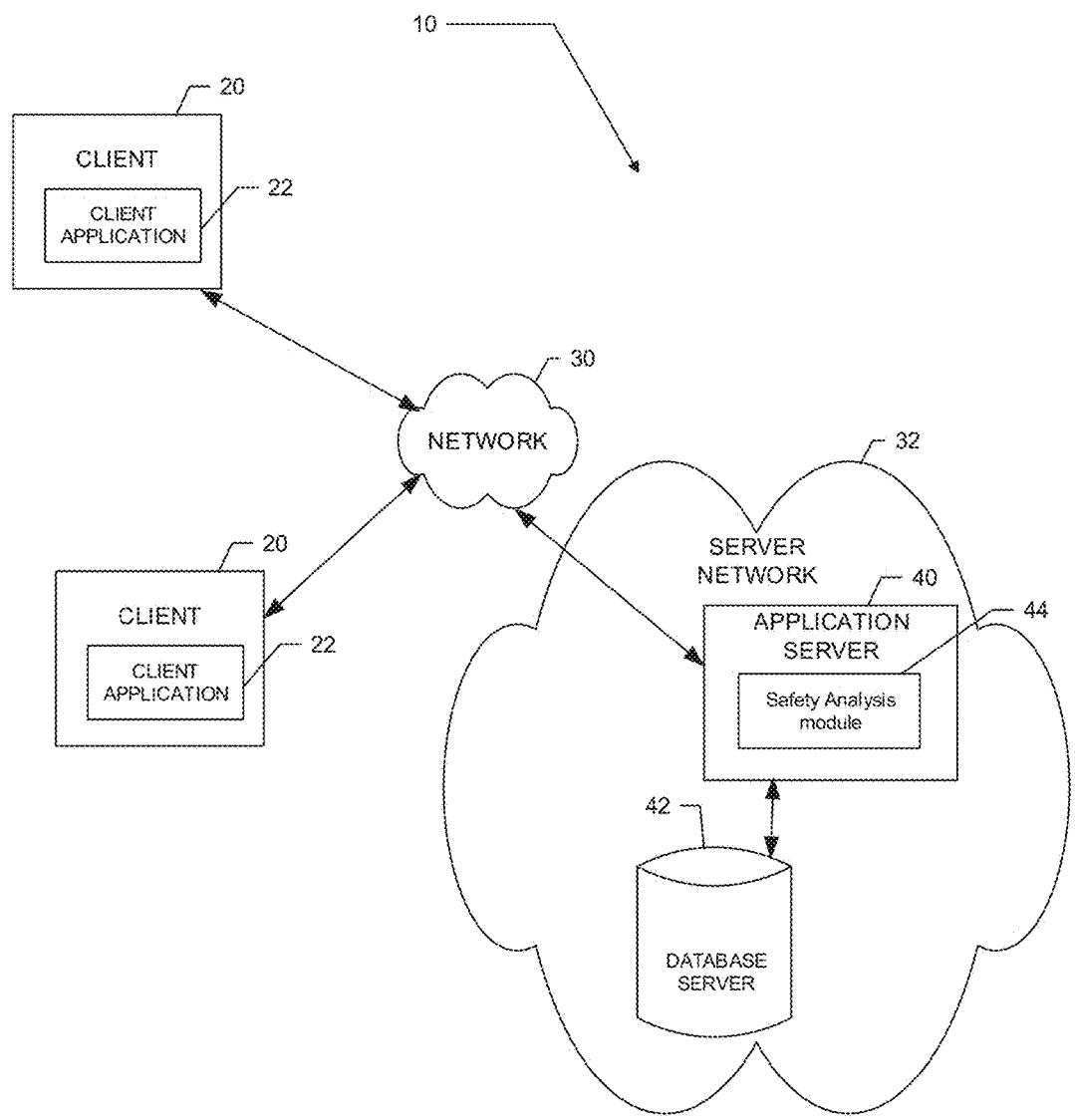
FIG. 1 illustrates a functional block diagram of a system that may be useful in connection with system safety analysis evaluation according to an example embodiment.

Some example embodiments now will be described more fully hereinafter with reference to the accompanying drawings, in which some, but not all example embodiments are shown. Indeed, the examples described and pictured herein should not be construed as being limiting as to the scope, applicability or configuration of the present disclosure. It will be apparent to those skilled in the art that modifications and variations can be made in such example embodiments without departing from the scope or spirit thereof. For instance, features illustrated or described in one embodiment may be used on another embodiment to yield a still further embodiment. Thus, it is intended that the present invention covers such modifications and variations as come within the scope of the appended claims and their equivalents. Like reference numerals refer to like elements throughout.

Further, the term "or" as used in this application and the appended claims is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be understood to mean "one or more" unless specified otherwise or clear from the context to be directed to a singular form. Throughout the specification and claims, the following terms take at least the meanings explicitly associated therein, unless the context dictates otherwise. The meanings identified below do not necessarily limit the terms, but merely provide illustrative examples for the terms. The meaning of "a," "an," and "the" may include plural references, and the meaning of "in" may include "in" and "on." The phrase "in one embodiment" or other similar phrase, as used herein, does not necessarily refer to the same embodiment, although it may.

The nature of phenomena addressed in an evaluation model may be diverse and subject to uncertainties in the modeling process. Consequently, analysis may rely on a hybrid of physics- and evidence-based computer codes for simulation of system processes, supplemented by various support tools providing task automation, pre-/post-processing, and data transfer/migration interfaces to peripheral activities. Per RG 1.203, in nuclear power applications, evaluation methodologies informed by analysis are expected for nuclear power plant (NPP) licensure applications.

Analysis uncertainty in modeling and simulation may have many sources, such as those associated with approximated models that describe the underlying physics; those associated with the settings of parameters used in physical models and correlations; those associated with performing a simulation at a given spatial resolution; those associated with initial and boundary conditions; and those associated with approximations in the numerical algorithms. Uncertainty quantification is the process of characterizing, estimating, propagating, and analyzing various kinds of uncertainty to support decision-making, such as the determination of one or more limiting scenarios, characterized in terms of bounding conditions for SSC inputs. As used herein a limiting scenario is an analytical scenario based on a design envelope reflecting the smallest safety margin with respect to acceptance criteria serving as a measure of thermal or hydraulic reactor plant damage due to an induced theoretical casualty, e.g. a design event, such as a loss of reactor coolant, steam line rupture, or the like. In nuclear safety analysis reports these are also referred to as Analysis of Record.

An apparatus and method for system safety analysis evaluation is provided, which may utilize a simulation engine, such as the RELAP5-3D thermal-hydraulic system code, for investigation and propagation of hypothetical event scenarios. The hypothetical event scenarios may be useful in determining operational parameters, e.g. temperatures, pressures, mass flow rates, or the like, for safe operation of the system under testing, for example nuclear reactor systems. In the context of nuclear reactor systems, the determination of operational parameters may be beneficial to protecting the integrity of the nuclear fuel.

The system safety analysis evaluation may include a benchmarking or convolution analysis in which the correlation between SSC inputs of the calculation matrix or resultant design envelope and a figure-of-merit may be determined. The benchmarking or convolution analysis may be used to resolve for the most useful SSC input for determination of the design envelope and one or more associated uncertainty models. The most useful SSC input may be those SSC inputs which would provide the most sensitivity in a figure-of-merit. Additionally or alternatively, the system safety analysis evaluation may quantitatively determine an assessment judgment of the data, wherein the assessment judgment may be used for determination of one or more limiting scenarios.

The determination of the design envelope may be based on the benchmarking or convolution analysis. The benchmarking or convolution analysis may result in the derivation of one or more limiting scenarios which may be more useful than random sampling, educated selection sampling, or complete sampling, therefore fewer calculations and/or simulations may be need to determine a liming scenario. Therefore the computational load may be reduced, causing faster processing of the data, which, as discussed, may have a higher reliability. The computational load may be further reduced, and reliability of the design envelope and associated limiting scenarios may be further increased, by utilizing qualitative and quantitative assessment judgments to limit the data sets used to demonstrate evaluation completeness.

In an example embodiment, a broad range of structures, systems, and components (SSCs) may be entered in into the calculation matrix, for example, vendor specifications for two or more components which may be for the same application. The determination of the design envelope may include, additionally or inherently, a determination of the components and specifications for a technical specification, e.g. operation tolerances, of the system.

Example System

An example embodiment of the invention will now be described in reference to FIG. 1, which illustrates an example system in which an example embodiment may be employed. As shown in FIG. 1, a system 10 according to an example embodiment may include one or more client devices (e.g., clients 20). Notably, although FIG. 1 illustrates two clients 20, it should be appreciated that a single client or many more clients 20 may be included in some embodiments and thus, the two clients 20 of FIG. 1 are simply used to illustrate a potential for a multiplicity of clients 20 and the number of clients 20 is in no way limiting to other example embodiments. In this regard, example embodiments are scalable to inclusion of any number of clients 20 being tied into the system 10. Furthermore, in some cases, some embodiments may be practiced on a single client without any connection to the system 10.

The example described herein will be related to an asset comprising a computer or analysis terminal to illustrate one example embodiment. However, it should be appreciated that example embodiments may also apply to any asset including, for example, any programmable device that is capable of receiving and analyzing files as described herein.

The clients 20 may, in some cases, each be associated with a single organization, department within an organization, or location (i.e. with each one of the clients 20 being associated with an individual analyst of an organization, department or location). However, in some embodiments, each of the clients 20 may be associated with different corresponding locations, departments or organizations. For example, among the clients 20, one client may be associated with a first facility of a first organization and one or more of the other clients may be associated with a second facility of either the first organization or of another organization.

Each one of the clients 20 may include or otherwise be embodied as a computing device (e.g., a computer, a network access terminal, a personal digital assistant (PDA), cellular phone, smart phone, or the like) capable of communication with a network 30. As such, for example, each one of the clients 20 may include (or otherwise have access to) memory for storing instructions or applications for the performance of various functions and a corresponding processor for executing stored instructions or applications. Each one of the clients 20 may also include software and/or corresponding hardware for enabling the performance of the respective functions of the clients 20 as described below. In an example embodiment, one or more of the clients 20 may include a client application 22 configured to operate in accordance with an example embodiment of the present invention. In this regard, for example, the client application 22 may include software for enabling a respective one of the clients 20 to communicate with the network 30 for requesting and/or receiving information and/or services via the network 30. Moreover, in some embodiments, the information or services that are requested via the network may be provided in a software as a service (SAS) environment. The information or services receivable at the client applications 22 may include deliverable components (e.g., downloadable software to configure the clients 20, or information for consumption/processing at the clients 20). As such, for example, the client application 22 may include corresponding executable instructions for configuring the client 20 to provide corresponding functionalities for distributed graph processing, as described in greater detail below.

The network 30 may be a data network, such as a local area network (LAN), a metropolitan area network (MAN), a wide area network (WAN) (e.g., the Internet), and/or the like, which may couple the clients 20 to devices such as processing elements (e.g., personal computers, server computers or the like) and/or databases. Communication between the network 30, the clients 20 and the devices or databases (e.g., servers) to which the clients 20 are coupled may be accomplished by either wireline or wireless communication mechanisms and corresponding communication protocols.

In an example embodiment, devices to which the clients 20 may be coupled via the network 30 may include one or more application servers (e.g., application servers 40), and/or a database servers 42, which together may form respective elements of a server network 32. Notably, although FIG. 1 illustrates one server network 32, it should be appreciated that many more server networks 32 may be included in some embodiments and thus, the single server network of FIG. 1 is simply used to illustrate a potential for a multiplicity of server networks and the number of server networks 32 is in no way limiting to other example embodiments. In this regard, example embodiments are scalable to inclusion of any number of server networks being tied into the system 10. Similarly, a network server may have one or a plurality of application servers 40 and/or database servers 42. Although the application server 40 and the database server 42 are each referred to as a "server," this does not necessarily imply that they are embodied on separate servers or devices. As such, for example, a single server or device may include both entities, and the database server 42 could merely be represented by a database or group of databases physically located on the same server or device as the application server 40. The application server 40 and the database server 42 may each include hardware and/or software for configuring the application server 40 and the database server 42, respectively, to perform various functions. As such, for example, the application server 40 may include processing logic and memory enabling the application server 40 to access and/or execute stored computer readable instructions for performing various functions. In an example embodiment, one function that may be provided by the application server 40 may be the provision of access to information and/or services related to operation of the terminals or computers with which the clients 20 are associated. For example, the application server 40 may be configured to provide for storage of information descriptive of models (e.g., analytical models, uncertainty models, or the like). In some cases, these contents may be stored in the database server 42. Alternatively or additionally, the application server 40 may be configured to provide analytical tools for use by the clients 20 in accordance with example embodiments.

In some embodiments, for example, the application server 40 may therefore include an instance of a safety analysis module 44 comprising stored instructions for handling activities associated with practicing example embodiments as described herein. As such, in some embodiments, the clients 20 may access the safety analysis module 44 online and utilize the services provided thereby. However, it should be appreciated that in other embodiments, the safety analysis module 44 may be provided from the application server 40 (e.g., via download over the network 30) to one or more of the clients 20 to enable recipient clients to instantiate an instance of the safety analysis module 44 for local operation. As yet another example, the safety analysis module 44 may be instantiated at one or more of the clients 20 responsive to downloading instructions from a removable or transferable memory device carrying instructions for instantiating the safety analysis module 44 at the corresponding one or more of the clients 20. In such an example, the network 30 may, for example, be a peer-to-peer (P2P) network where one of the clients 20 includes an instance of the safety analysis module 44 to enable the corresponding one of the clients 20 to act as a server to other clients 20. In a further example embodiment, the safety analysis module 44 may be distributed amongst one or more clients 20 and/or the application server 40.

In an example embodiment, the application server 40 may include or have access to memory (e.g., internal memory or the database server 42) for storing instructions or applications for the performance of various functions and a corresponding processor for executing stored instructions or applications. For example, the memory may store an instance of the safety analysis module 44 configured to operate in accordance with an example embodiment of the present invention. In this regard, for example, the safety analysis module 44 may include software for enabling the application server 40 to communicate with the network 30 and/or the clients 20 for the provision and/or receipt of information associated with performing activities as described herein. Moreover, in some embodiments, the application server 40 may include or otherwise be in communication with an access terminal (e.g., a computer including a user interface) via which analysts may interact with, configure or otherwise maintain the system 10.

Example Apparatus

Figure 2:
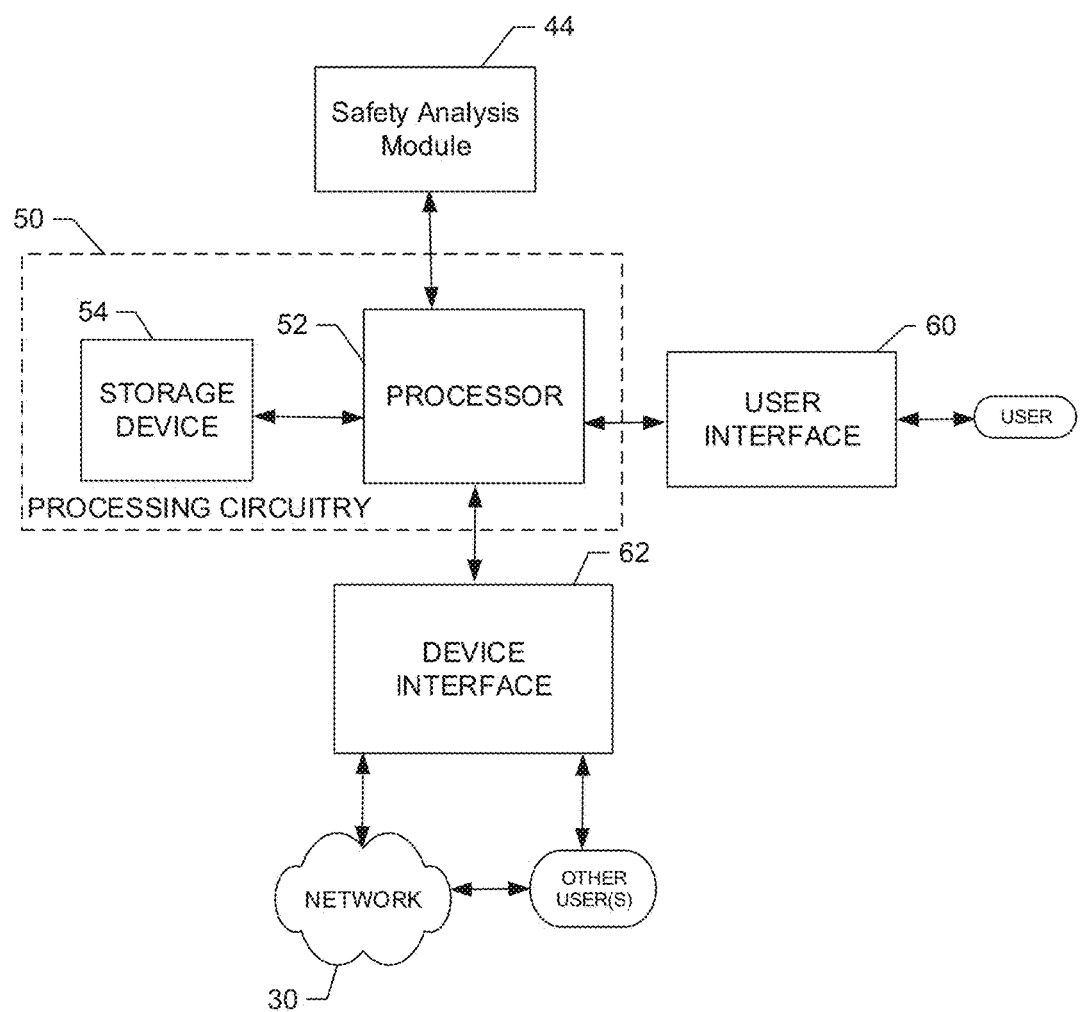
FIG. 2 illustrates a functional block diagram of an apparatus that may be useful in connection with system safety analysis evaluation according to an example embodiment.

An example embodiment of the invention will now be described with reference to FIG. 2. FIG. 2 shows certain elements of an apparatus for distributed safety analysis according to an example embodiment. The apparatus of FIG. 2 may be employed, for example, on a client (e.g., any of the clients 20 of FIG. 1) or a variety of other devices (such as, for example, a network device, server, proxy, or the like (e.g., the application server 40 of FIG. 1)). Alternatively, embodiments may be employed on a combination of devices. Accordingly, some embodiments of the present invention may be embodied wholly at a single device (e.g., the application server 40 or one or more clients 20) or by devices in a client/server relationship (e.g., the application server 40 and one or more clients 20). Furthermore, it should be noted that the devices or elements described below may not be mandatory and thus some may be omitted in certain embodiments.

Referring now to FIG. 2, an apparatus configured for system safety analysis evaluation is provided. The apparatus may be an embodiment of the safety analysis module 44 or a device hosting the safety analysis module 44. As such, configuration of the apparatus as described herein may transform the apparatus into the safety analysis module 44. In an example embodiment, the apparatus may include or otherwise be in communication with processing circuitry 50 that is configured to perform data processing, application execution and other processing and management services according to an example embodiment of the present invention. In one embodiment, the processing circuitry 50 may include a storage device 54 and a processor 52 that may be in communication with or otherwise control a user interface 60 and a device interface 62. As such, the processing circuitry 50 may be embodied as a circuit chip (e.g., an integrated circuit chip) configured (e.g., with hardware, software or a combination of hardware and software) to perform operations described herein. However, in some embodiments, the processing circuitry 50 may be embodied as a portion of a server, computer, laptop, workstation or even one of various mobile computing devices. In situations where the processing circuitry 50 is embodied as a server or at a remotely located computing device, the user interface 60 may be disposed at another device (e.g., at a computer terminal or client device such as one of the clients 20) that may be in communication with the processing circuitry 50 via the device interface 62 and/or a network (e.g., network 30).

The user interface 60 may be in communication with the processing circuitry 50 to receive an indication of a user input at the user interface 60 and/or to provide an audible, visual, mechanical or other output to the user. As such, the user interface 60 may include, for example, a keyboard, a mouse, a joystick, a display, a touch screen, a microphone, a speaker, a cell phone, or other input/output mechanisms. In embodiments where the apparatus is embodied at a server or other network entity, the user interface 60 may be limited or even eliminated in some cases. Alternatively, as indicated above, the user interface 60 may be remotely located.

The device interface 62 may include one or more interface mechanisms for enabling communication with other devices and/or networks. In some cases, the device interface 62 may be any means such as a device or circuitry embodied in either hardware, software, or a combination of hardware and software that is configured to receive and/or transmit data from/to a network and/or any other device or module in communication with the processing circuitry 50. In this regard, the device interface 62 may include, for example, an antenna (or multiple antennas) and supporting hardware and/or software for enabling communications with a wireless communication network and/or a communication modem or other hardware/software for supporting communication via cable, digital subscriber line (DSL), universal serial bus (USB), Ethernet or other methods. In situations where the device interface 62 communicates with a network, the network may be any of various examples of wireless or wired communication networks such as, for example, data networks like a Local Area Network (LAN), a Metropolitan Area Network (MAN), and/or a Wide Area Network (WAN), such as the Internet.

In an example embodiment, the storage device 54 may include one or more non-transitory storage or memory devices such as, for example, volatile and/or non-volatile memory that may be either fixed or removable. The storage device 54 may be configured to store information, data, applications, instructions or the like for enabling the apparatus to carry out various functions in accordance with example embodiments of the present invention. For example, the storage device 54 could be configured to buffer input data for processing by the processor 52. Additionally or alternatively, the storage device 54 could be configured to store instructions for execution by the processor 52. As yet another alternative, the storage device 54 may include one of a plurality of databases (e.g., database server 42) that may store a variety of files, contents or data sets. Among the contents of the storage device 54, applications (e.g., client application 22 or server application 44) may be stored for execution by the processor 52 in order to carry out the functionality associated with each respective application.

The processor 52 may be embodied in a number of different ways. For example, the processor 52 may be embodied as various processing means such as a microprocessor or other processing element, a coprocessor, a controller or various other computing or processing devices including integrated circuits such as, for example, an ASIC (application specific integrated circuit), an FPGA (field programmable gate array), a hardware accelerator, or the like. In an example embodiment, the processor 52 may be configured to execute instructions stored in the storage device 54 or otherwise accessible to the processor 52. As such, whether configured by hardware or software methods, or by a combination thereof, the processor 52 may represent an entity (e.g., physically embodied in circuitry) capable of performing operations according to embodiments of the present invention while configured accordingly. Thus, for example, when the processor 52 is embodied as an ASIC, FPGA or the like, the processor 52 may be specifically configured hardware for conducting the operations described herein. Alternatively, as another example, when the processor 52 is embodied as an executor of software instructions, the instructions may specifically configure the processor 52 to perform the operations described herein.

In an example embodiment, the processor 52 (or the processing circuitry 50) may be embodied as, include or otherwise control the safety analysis module 44, which may be any means, such as, a device or circuitry operating in accordance with software or otherwise embodied in hardware or a combination of hardware and software (e.g., processor 52 operating under software control, the processor 52 embodied as an ASIC or FPGA specifically configured to perform the operations described herein, or a combination thereof) thereby configuring the device or circuitry to perform the corresponding functions of the safety analysis module 44 as described below.

The safety analysis module 44 manager may include tools to facilitate distributed safety analysis via the network 30. In an example embodiment the safety analysis module 44 may be configured for generating a calculation matrix for a system, generating a plurality of models based on the calculation matrix, performing a convolution analysis of the plurality of models, defining a design envelope based on a benchmarking or convolution analysis, deriving one or more uncertainty model based on the benchmarking or convolution analysis, deriving an assessment judgment based on the design envelope and an acceptance criteria, and determining a safety margin at least one figure-of-merit for the system based on the design envelope, one or more limiting scenarios, and the acceptance criteria. In an example embodiment, the at least one figure-of-merit is used to measure the safety margin of the system.

Example System Safety Analysis Evaluation

Figure 3:
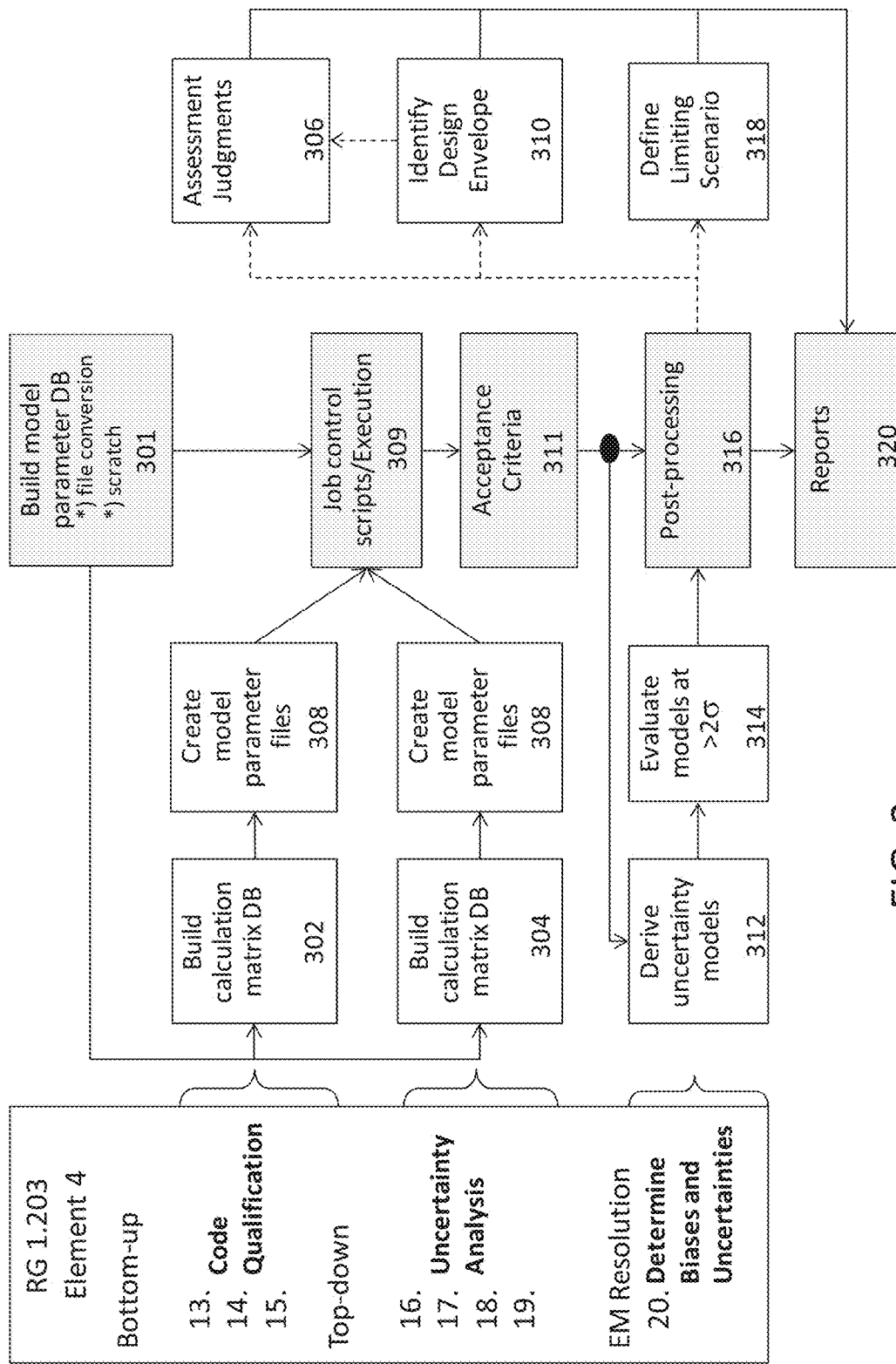
FIG. 3 illustrates a process chart for system safety analysis evaluation according to an example embodiment.
Figure 4:
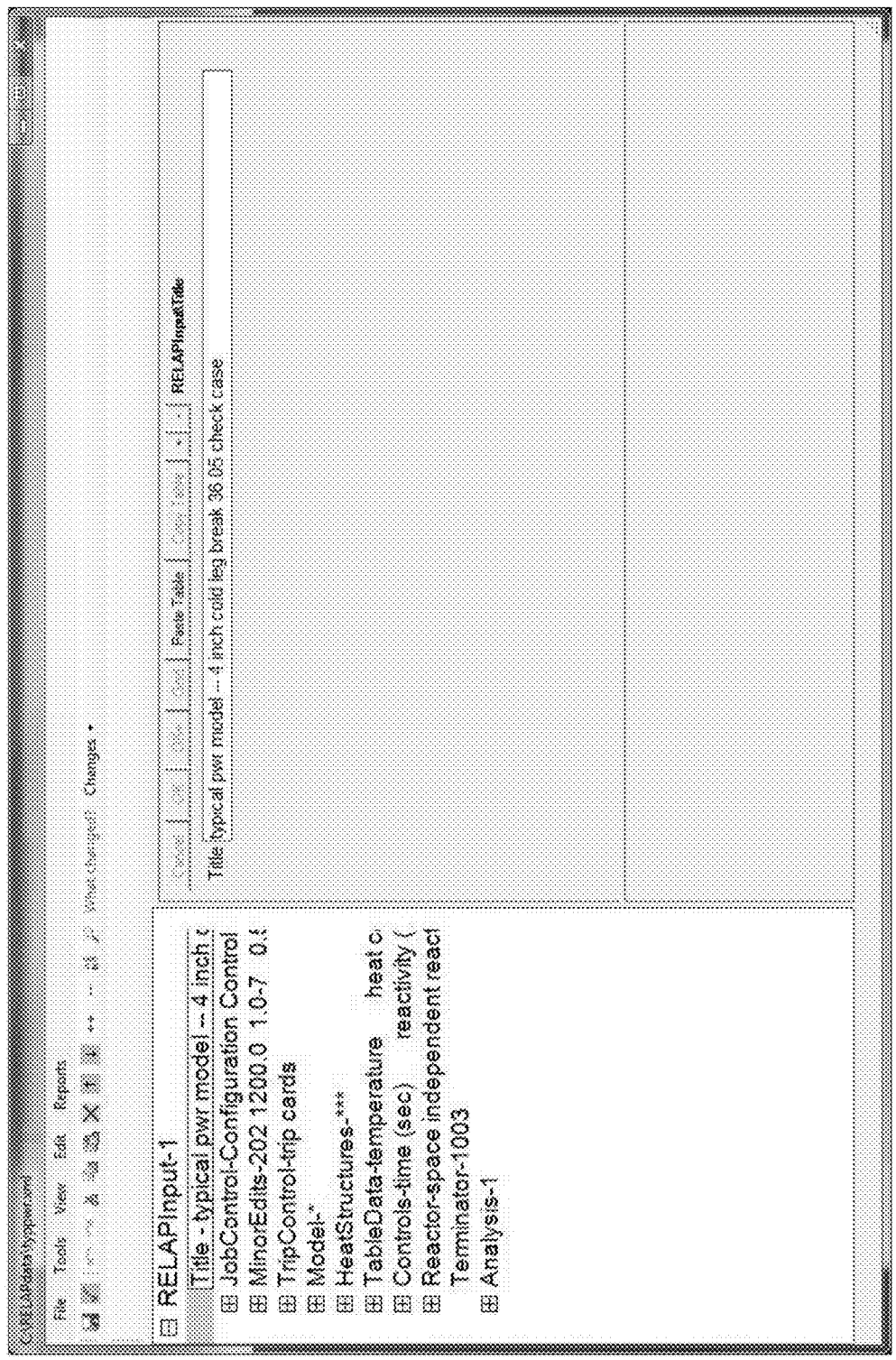
FIG. 4-8 illustrates user interface displays according to an example embodiment of the present invention.

An example embodiment will now be described in general terms in relation to system safety analysis evaluation. FIG. 3 illustrates a process chart for system safety analysis evaluation according to an example embodiment. The process is depicted in parallel with RG 1.203 requirements. The process chart of FIG. 3 is depicted as the blocks relate to the RG 1.203, and as such the blocks, e.g., "create model parameter files 308", may be duplicated in an instance in which they are relevant to more than one section of RG 1.203. Safety analysis evaluation is primarily performed in the latter steps of RG 1.203. RG 1.203 entitles these latter steps as "Demonstration of Evaluation Model Adequacy", which includes the principal goal of quantifying safety margin, but also evaluation model solutions that verify early RG 1.203 steps.

Entry into the evaluation model apparatus and method begins with a model parameter database 301 of SSC inputs. In some embodiments, the model parameter database 301 is built manually from by a safety evaluation model user from original SSC data. Building a model parameter database 301 may also involve converting a file formatted for a simulation engine, such as RELAP5, to the set of essential SSC inputs.

The calculation matrix 302 and calculation matrix 304 are knowledge components that may be representative of an event domain, e.g. the space of a system simulation. These differ with respect to whether the calculation matrix is deterministic for benchmarking analysis or probabilistic for convolution analysis, respectively. The event domain may be defined by identification of key system models parameters, as discussed below. A calculation matrix 302 or calculation matrix 304 may be built for a nuclear power complex as a whole, a reactor plant, groups or individual systems, or the like, for analysis. Reactor plant systems may include, without limitation, a cooling system, such as a reactor coolant system, a steam system, such as a steam generator and associated steam header and/or steam turbines, feed systems, charging systems, discharge systems, coolant and/or steam pressure relief systems, or the like.

RG 1.203 Element 4, 13-15 includes a bottom-up evaluation, e. g. a qualification of the code and or inputs used to build models, performing a benchmarking analysis, identification of the design envelope, derivation of uncertainty models, and derivation of an assessment judgment. To address the qualification of the code, the system safety analysis evaluation may build a calculation matrix database 302. The calculation matrix database 302 may include structure, system, or component (SSC) inputs from one or more analytical models.

As an illustration of the code qualification process, SSC inputs describing an existing or previously-operated thermal-hydraulic system may be received by a computing device, such as the apparatus of FIG. 2. A selection of inputs reflecting operation or faulted conditions plus analytical uncertainty associated with the operation or faulted condition inputs may be received by the computing device. The computing device may algorithmically build a calculation matrix 302 based on SSC inputs from one or more analytical models, from one or more databases, such as storage device 54. From the calculation matrix, model parameter files 308 of the original tests may be created. The benchmarking analysis may be complete when the set of model parameter files 308, derived from the model parameter database 301 and the calculation matrix 302, are processed through a simulation engine employed in the system safety analysis evaluation 309. Simulation results may be filtered based on one or more figures-of-merit.

RG 1.203 also includes a top-down analysis at Element 4, 16-19, e.g. a convolution analysis of the parameters selected from the calculation matrix 304. The top-down analysis may also include the building of the calculation matrix 304, performing a convolution analysis, identifying the design envelope 310, deriving uncertainty models, deriving an assessment judgment 306, and defining one or more limiting scenarios 318, as discussed below.

A computing device, such as the apparatus of FIG. 2, may build a calculation matrix 304 based on (SSC) inputs from one or more analytical models, from one or more databases, such as storage device 54. The models may include SSC inputs including but not limited to dimensions, e.g. size and shape, material characteristics, such as heat transfer coefficient and fracture toughness, or the like. In that regard, an example SSC input may be a 4 ft reactor coolant pipe with a pipe diameter of 8 inches. Another example SSC input may be an operation condition such as power level or system pressure. The models may comprise vendor component or operations specifications, historical testing or operations data, or theoretical calculations based on functional requirements, such as heat transfer, fluid flow, or the like. In some example embodiments, the models may also describe the underlying physics; e.g. physics associated with the settings of parameters used in physical models and correlations; physics associated with performing a simulation at a given spatial resolution; and physics associated with approximations in numerical algorithms. Uncertainty quantification may be the process of characterizing, estimating, propagating, and analyzing all kinds of uncertainty to support decision-making.

In the building of the calculation matrix 304, the computing device may receive and apply uncertainties associated with the analytical model's SSC inputs. The uncertainties may comprise variances in the nominal SSC input. For example an 8 inch pipe may have uncertainty of +/−3 inches. In some example embodiments, the calculation matrix may include bias values associated with possible values within the variance of the uncertainty. For example, an uncertainty of +/−3 inches may have associated bias values of +1 inch, +1.5 inches, +2 inches, −3 inches, or the like. That is, e.g., a nominal eight inch pipe with a +/−3 inch variance and a +1 inch bias can be expected to vary from 5 inches to 11 inches and is, in this instance, nine inches. Other uncertainties may be applied, such as operational uncertainties, such as power level, system pressures and temperatures, and control system setpoints; phenomena uncertainties, such as heat transfer and material property parameters appearing in physical models and correlations; event uncertainties, including the status (e.g., nominal, available, or faulted) of equipment; or the like.

Additionally or alternatively, building the calculation matrix 304 may also include receiving casualty models, such as loss of reactor coolant, steam line rupture, loss of coolant flow, rod movement independent of control, or the like. The casualty models may include nominal parameters and uncertainties, similar to the analytical models discussed above. The casualty models may be generated as theoretical calculations and/or from agency test requirements, such as RG 1.203. An example convolution analysis portion of a calculation matrix is depicted in Table 1 below for a hypothetical pressurized water reactor simulation engine test problem. Table 1 includes initial condition parameters for a reactor plant, such as total reactor power, decay heat, reactor coolant system (RCS) pressure, and accumulator initial pressure. Table 1 also includes the uncertainties associated with each parameter described by statistical distribution type and associated parameters. One or more statistical distribution types, including, but not limited to, uniform, normal, log normal, beta, gamma, stepwise, and discrete, may be employed in characterizing the event domain. Additionally, the calculation matrix of Table 1 includes a casualty parameter, break area, and its associated uncertainty.

TABLE 1

| Parameter of Interest | Distribution Type | Characterization |
| --- | --- | --- |
| Break Area | Uniform | 0.0 to 1.3 ft$^2$ |
| Total Reactor Power | Normal | $\mu = 1\%$ |

TABLE 1-continued

| Parameter of Interest | Distribution Type | Characterization |
|---|---|---|
| Decay Heat | Normal | μ = 5% |
| RCS Pressure | Uniform | +/−20 psi |
| Accumulator initial pressure | Uniform | +/−20 psi |
| Break discharge efficiency | Uniform | 0.9-1.1 |
| Core convective heat transfer | Uniform | 0.9-1.1 |

In an example embodiment, the computing device may create a suite of model parameter files 308 for a convolution-type system safety analysis evaluation 309. The model parameter files represent one possible realization of the calculation matrix database 304 and may appear as either a collection of model parameter samples or embedded in a file formatted for use in a simulation engine, such as RELAP5.

The convolution of many contributors to model uncertainty may be a statistical process, applying either a parametric or nonparametric method. Performance of the convolution analysis may include an objective statement relating to the identification of resulting samples of figures-of-merit. The objective statement is a statistical statement about a result sample's coverage among all possible outcomes. Prior to a convolution analysis the objective statement may be used to calculate the number of model parameter files 308 for the convolution analysis. In one example embodiment, a nonparametric approach utilizes a function expressing this objective statement specifically for handling both small and large sample sets. The nonparametric approach has the advantage of independence between the number of uncertainty parameters and the number of required calculations to address a given expectation.

In an example embodiment of a nonparametric approach to the convolution analysis, the objective statement may be expressed for a sorted sample among n samples of a random variable, such that $\{x_1 < x_2 < \ldots < x_k < \ldots < x_n\}$. In this scenario, the probability statement identifying any sample bounding a fraction γ of the population of x may be written in terms of the convenience function m=n-k as:

$$P[F(x_k) > \gamma] = \beta = \int_{x_k}^{\infty} g_m(\xi) d\xi \qquad \text{Eqn. (1)}$$

Here $g_m(\gamma)$ is the probability density function of the population coverage of a particular sorted sample. A function for $g_m(\gamma)$ can be derived and the well-known solution for the probability that the fraction of the parent population less than $x_k$ is at least γ can be shown to be a function of the Incomplete Beta function, $$\beta = P[F(x_k) > \gamma] = 1 - I_\gamma(m, n-m+1), \qquad \text{Eqn. (2)}$$

Given a statistical objective for β and γ, this functional can be rearranged to calculate the number of model parameter files 308 for the convolution analysis.

Similar to the benchmarking analysis, the convolution analysis may be complete when the set of model parameter files 308, derived from the model parameter database 301 and the calculation matrix 304, are processed through the simulation engine employed in the system safety analysis evaluation 309. In some example embodiments, the simulation results may be filtered based on one or more figures-of-merit. Individual simulation results may represent one realization of the uncertainty domain for a given figure-of-merit.

RG 1.203 element 4, step 20 completes the evaluation model through quantification of biases and uncertainties in the figure(s)-of-merit. In safety analysis applications, safety analysts seek an Analysis of Record, whose attributes include inherent treatment of event domain uncertainties. In an example embodiment, deriving uncertainty models 312 may include evaluating particular statistical measures from event domain samples and figures-of-merit samples; and post-processing 316 of the statistical measures may provide a knowledge component characterizing the Analysis of Record in terms of qualitative assessment judgments 306, quantified design envelope 310, and one or more limiting scenarios 318, as discussed below. In some example embodiments, correlations between sets of event domain samples and one or more sets of figures-of-merit uncertainty domain samples may provide information useful in demonstrating the adequacy of an evaluation model. Translations of the event domain samples and one or more sets figures-of-merit uncertainly domain samples, informed by correlation, may be constructed as sets of weighted measures with the characteristic that their convolution reproduces an estimate of the uncertainty domain represented by the sample set of any calculated figure-of-merit.

Given a set of sampled realization from an event domain and associated figures-of-merit, several techniques are available for characterizing event domain uncertainty models, e.g. deriving uncertainty models 312. In some embodiments, the computing device may employ variance based methods to derive uncertainties models 312, as discussed below, resolving a standard deviation, $\sigma_x$, in a calculated figure-of-merit with respect to the sampling of a particular model parameter.

In selecting the standard deviation as the desired measured, a mathematical algorithm, embodying the deriving uncertainties model 312, may be drawn from statistical concepts involving the definition of the variance, which may be the square of the standard deviation. The definition of the variance, may be expressed as:

$$\text{Var}[x] = \sigma^2 \qquad \text{Eqn. (3)}$$

The statistical treatment may be a multi-variant analysis of variance calculation. The statistical treatment may depart from "standard" approach by relying on a stepwise multiple-variable regression approach rather than a direct least-squares matrix solution, which may be necessary when working with small sample sets.

Given a best-estimate predictor model represented as $x_0 = \text{fct}(x_1, x_2, x_3, \ldots, x_n)$, the total variance in sampled values of the dependent variable, now the random variable $x_0$ may be a statistical measure relating the combined variance of several independent uncertainty contributors, appearing as the random variables $x_i$. In an example embodiment, it may be assumed that $x_0$ is a function of a linear combination of random variables $x_i$, that the random variables $x_i$ are independent, and that the uncertainty vector is drawn from a simple sampling. From this definition of statistical variance, the total variance in the particular dependent variable, $\text{Var}[x_0]$, may be expressed as:

$$\text{Var}[x_0] \approx \text{Var}[x_1 + x_2 + \ldots + x_n] = \Sigma_{i=1}^n \text{Var}[x_i] \qquad \text{Eqn. (4)}$$

This approach is a special case of the generalized variance-decomposition approach by Sobol and Saltelli for processes and simulations with nonlinear and correlated parameters.

Given in terms of the Expected Value, the variance in Eqn. 5 is expressed as:

$$\text{Var}[x_0] = E[(x_0 - \eta_0)^2] \approx \Sigma_{i=1}^n E[(x_i - \eta_i)^2] \qquad \text{Eqn. (5)}$$

For finite sample sets, this expression is given in terms of sample variances as:

$$\text{Var}[x_0] \approx \Sigma_{j=1}^m \Sigma_{i=1}^n (x_{ij} - \eta_i)^2 / m \qquad \text{Eqn. (6)}$$

In this example, $\Sigma\Sigma x_{i,j}$ represents a nested summation function of n sample sets of $x_i$ each of set size m.

Quantifying the uncertainty contribution of specific model parameters may include a decomposition of the total variance measure. Decomposition of the total variance measure may be accomplished by a stepwise regression approach, which extends an application of curve-fitting to multiple variables. In an example embodiment of the stepwise regression, an assumption may be applied that there exists a linear relationship between the dependent variable, $x_0$, and two or more independent variables, $x_i$, such that $$x_0 = \eta + fct(x_1) + fct(x_2) + \ldots + fct(x_n) \quad \text{Eqn. (7)}$$

Each regression function, e.g., $fct(x_1)$, may be an empirical relationship that expresses how the dependent variable varies with each model parameter. A direct solution for the regression coefficients in the multiple-regression model may be evaluated applying least-squares techniques; however, in an example embodiment, successive stepwise evaluation of the model may be beneficial due to small datasets providing limited information for resolving the model. In addition, the successive evaluation approach may allow choice among possible estimator functions derived from the least-squares technique. In choosing among estimator functions, a simple form may be best aligned with physical expectations, for example, a linear or second order polynomial fit may be sufficient to reflect the physical variation of a figure-of-merit to variation of a single model parameter. In some example embodiments, a linear dependence may be most likely, particularly for relatively small ranges of uncertainties, for which the analytical model may be well described by perturbation theory. The computing device may distinguish between using a linear or a second-order polynomial regression function based on a coefficient of determination expressed as:

$$R^2 = 1 - \Sigma_i(y_i - fct(x_i))^2 / \Sigma_i(y_i - \eta_y)^2 > 0.7 \quad \text{Eqn. (8)}$$

The numerator in Eqn. 8 is the residual sum of the squares, with $y_i$ as the sample figure-of-merit value and $\eta_y$ being the mean; and the denominator the total sum of the squares, with $(x_i)$ as the estimated value of the figure-of-merit from the regression function. The transition between linear to second-order polynomial is 0.7 in the illustrated example; however the transition may be other values, such as 0.5, 0.6, 0.8, or the like, given the relatively simple regression forms being applied, the results sensitivity to the rule is minor.

The computing device may define a measure useful for identifying the important sampled model parameters and a measure for identifying when the usefulness of the data for resolving the model is exhausted. With regard to the measure useful for identifying the important sampled model parameters, several rank and correlation expressions from sensitivity analysis may be utilized, such as the Standardized Rank Regression Coefficient, Rank Correlation Coefficients, and Correlation Ratios. The "Rank" methods may replace data with the corresponding ranks, removing information from the data. In contrast, the sample correlation coefficient, r, retains the information, and therefore may produce a more desirable analysis result. A sample correlation coefficient may be expressed as:

$$r_{xy} = [\Sigma(x - \eta_x)(y - \eta_y)] / [\sqrt{(\Sigma(x - \eta_x)^2(y - \eta_y)^2)}] \quad \text{Eqn. (9)}$$

In this example, the correlation of interest is between the sampled model parameters and the analysis measure results. With relatively small sample sizes, sample sets of uncorrelated parameters may have significant correlation. Another objective related to the stepwise multiple regression may be to identify a sample correlation significance threshold for which there is a high confidence that the correlation is not simply coincidence. This may acknowledge, such as in examples with small sample sets, there may be insufficient information to fully describe the regression model. To identify the threshold below which no more information about the model can be resolved, a threshold test may be defined. The threshold test may be derived from the sampling distribution of the correlation coefficient. In the example embodiment, in which model parameters have been independently sampled, the sampling distribution may correspond to a Student t-distribution. Specifically, statistic coverage ($t_p$) may be related to the correlation coefficient for n samples in the equation, as express as:

$$t_p = t_p = r\sqrt{(n-2)} / \sqrt{(1-r^2)} \quad \text{Eqn. (10)}$$

The desired result may be a correlation coefficient threshold, $r_{min}$. The previous expression may be rearranged to solve for r, expressed as:

$$r_{min} = t_p / \sqrt{(n - 2 + t_p^2)} \quad \text{Eqn. (11)}$$

A curve fit can simplify this solution. One example curve fit, confirmed for n=2 to 10,000,000 samples, may be the following polynomial function, derived empirical from using the inverse Student-T distribution function, may approximate Eqn. 11, $$r_{min} = 10^{\wedge}[-0.00026729 * \log_{10}(n)^6 + 0.0062645 * \log_{10}(n)^5 - 0.057558 * \log_{10}(n)^4 + 0.26264 * \log_{10}(n)^3 - 0.62035 * \log_{10}(n)^2 + 0.21007 * \log_{10}(n) - 0.010539] \quad \text{Eqn. (12)}$$

The curve fit of Eqn. 12 is for illustrative purposes; one of ordinary skill in the art would immediately understand that alternative curve fits may be used and provide equal functionality.

Characterizing the dominant sampled model parameter statistics in the stepwise multiple regression may end in an instance in which the largest correlation between a sampled model parameter and the analysis measure of interest among the set of sampled model parameters is less than $r_{min}$. With the selection of the correlation coefficient and the identification of the "significance threshold," the quantifying process and phenomenological importance portion of the system safety analysis evaluation may proceed.

An initial important sampled model parameter may be identified by the largest correlation between the sampled model parameters and the dependent analysis measure, assuming there is at least one model parameter above the significance threshold. The computing device may determine the value of the variance of that first individual uncertainty contributor, by first, evaluating the regression function $fct(x_1)$ that estimates the relationship between a figure-of-merit sample vector $\vec{x}_0$ and a first uncertainty contributor sample vector $\vec{x}_1$. A new sample vector, $fct(x_1)$, may be evaluated which describes only that component of the figure-of-merit sample vector $\bar{x}_1$ that varies with the first uncertainty contributor $\vec{x}_1$. The variance $Var[\vec{x}_1]$ represents an estimate for $Var[x_1]$.

Following the evaluation of the variance, the standard deviation may be determined from the square root. This standard deviation may be interpreted as the importance measure, represented as the sensitivity of the dependent variable (e.g. the analysis figure-of-merit) from the sampling variation of a particular sampled model parameter. Further resolution of the independent sampled model parameters may continue in a stepwise manner with the dependent variable transformed by the functional estimates of the previously evaluated important sampled model parameters. For example, the regression and the second uncertainty contributor sample vector $\vec{x}_2$ is found by removing the influence function fct($x_2$) that estimates the relationship between the figure-of-merit sample vector $\vec{x}_0$ of the first uncertainty contributor $\vec{x}_1$, that is, $\vec{x}_0$-$\vec{x}_1$, (i.e., the error between the figure-of-merit and the curve-fit estimate derived for the first individual uncertainty contributor against the figure-of-merit). A sample vector fct($x_2$) may be evaluated, by the computing device, describing only that component of the figure-of-merit sample vector, $\vec{x}_2$, which varies with the second uncertainty contributor $x_2$. Similar to Var[$\vec{x}_1$] discussed above, the variance Var[$\vec{x}_2$] represents an estimate for Var[$x_2$].

In an example embodiment, fct($x_k$) may be the regression function for the $k^{th}$ estimate derived from the paired set of $\vec{x}_k$ and the figure-of-merit sample vector $\vec{x}_0$ minus the previously evaluated terms, expressed as:

$$fct(x_k) \equiv (\vec{x}_k, \vec{x}_0 - \Sigma_{i-1}^{k-1} \vec{x}_i) \quad \text{Eqn. (13)}$$

Similarly, $$\text{Var}[x_{0,k}]_{est} = \text{Var}[\vec{x}_0 - \Sigma_{i-1}^{k-1} \vec{x}_i]_{est} \quad \text{Eqn. (14)}$$

The regression may iterate until the set of sample correlations between the specific uncertainty contributors and the analysis measure fails the significance threshold criteria. The remaining variance may not be further decomposed without unmeasurable degradation in precision of the results. In an example embodiment greater resolution may be achieved by adding more data, e.g. through more sample calculations, or a new analysis that introduces certainty for the dominant uncertainty contributors. The remaining variance or residual may be a knowledge component defining an uncertainty model for the influence of the collection of less significant phenomena.

The computing device may organize the derived figure-of-merit uncertainty models from deriving uncertainty models 312 based on a minimum number of calculations that result in a high probability that acceptance criteria limits are not exceeded. The uncertainty models may be a mean and standard deviation pair, which with the exception of the defining or initial model $x_0$ have a mean of zero. The standard deviations may be ordered by magnitude and cumulatively summed, which may be equivalently described as the convolution of the estimated uncertainties, (i.e., the square root of the sum of the individual variances); expressed as:

$$\sigma_0|_{est} = \text{sqrt}(\Sigma_{i=1}^m \text{Var}[x_i]|_{est}) \quad \text{Eqn. (15)}$$

where m is the number of important uncertainty contributors (less than n) identified in the analysis. The ratio of the sums to the total may be calculated. When the cumulative sum exceeds a desired threshold, such as 0.9, 0.85, 0.95, or the like, the individual variances may be designated as the set of "important model parameters." The important model parameter set may be a safety analysis knowledge component that supports verification of early RG 1.203 steps. The important model parameter set may be evaluated at >2σ 314 to deterministically bound the coverage space with respect to an objective to either minimize or maximize a figure-of-merit. These values represent alternative code biases sought in this RG 1.203 step.

A post-processing 316 function may filter or organize calculation results and uncertainty models. The SSC design inputs, calculation matrix, event domain samples, calculation figures-of-merit, assessment judgments, design envelope, limiting scenario, safety margins, or the like may be, in an example embodiment, output in various reports 320, such as tables, graphs, scatter plots or the like.

Calculation results and uncertainty models may receive further transformation as knowledge components. These include an assessment judgment, a design envelope, and one or more limiting scenarios. Qualitative assessment judgments 306 are algorithmically determined based on exceedance of one or more correlation thresholds. The assessment judgment 306 is a qualitative determination of the goodness of the input data used in the benchmarking or convolution analysis. A set of analysis figures-of-merit that may or may not change with time defines a design envelope 310. The one or more limiting scenarios 318 may be defined by quantifying biases of significant model parameters.

A knowledge component useful for demonstrating evaluation model adequacy relates to assessment judgments 306 that qualitatively determine the "goodness" of uncertainty models against acceptance criteria. The assessment judgments 306 used to determine goodness may be qualitative statements such as "excellent" or "reasonable." Such assessment judgments are considered to indicate code performance in terms of usefulness for decision-making by regulators.

A quantitative approach may be defined to help make qualitative assessment judgments 306 of goodness. The quantitative approach may utilize the estimated uncertainty and the difference between the calculated and measured results. The absolute error at each designated time point in a calculation may be calculated based on the absolute value of the difference between the calculated and measured parameters. A normalized error may then obtained by dividing the absolute error by the estimated uncertainty. The fraction of time points when the normalized error is less than a given factor may then be determined.

In some example embodiments, the computing device may compare the fraction of time when the normalized error is less than a given factor to one or more predetermined goodness thresholds, such as excellent, reasonable, minimal, or the like to determine an assessment judgment 306. In an example embodiment, an assessment judgment 306 of excellent may be determined in an instance in which at least 90% of the normalized errors must be less than one, which corresponds to the calculated parameter being within the uncertainty 90% of the time. In an example embodiment, an assessment judgment 306 of reasonable may be determined in an instance in which at least 70% of the points must lie within three times the uncertainty, which corresponds to the calculated parameter being within three times the uncertainty 70% of the time. The factor of three quantifies the meaning of "near" and the 100–70=30% quantifies "frequently," as used in the definition of "reasonable" in RG 1.203.

In some example embodiments, the assessment judgment 306 may also include user judgments, e.g. engineering judgments. The engineering judgments may compensate for measurement uncertainty variance across analyses and/or variance of independent measurements. In some example embodiments, engineering judgments may also be utilized to compensate for offsets in time. For example, a time offset can cause a calculated parameter to be far outside of an uncertainty band, which could lead to assessment judgments 306 of minimal or insufficient, when trends, slopes, maximum values, and minimum values are all predicted well, which would lead to assessment judgments 306 of excellent or reasonable.

In an example embodiment, the computing system may utilize an assessment judgment 306 in the determinations of the operating parameters. In one such embodiment, the computing system may use model data associated with an excellent or reasonable assessment judgment 306 in the determination of operating parameters.

In an example embodiment, the evaluation of the design envelope 310 may be derived from a comparison between simulation results and acceptance criteria. With small sets of figures-of-merit the design envelope may be a statistical statement reflecting a figure-of-merit measure to the acceptance criteria. In benchmarking analysis, the design envelope may be a statement about the robustness of the simulation. In convolution analysis, the design envelope 310 may be a statement about the robustness of the design of the system.

In an example embodiment utilizing convolution analysis, the convolution of the event domain may rely on a Monte-Carlo sampling approach, seeking a statistical statement about a particular random sample within a set of samples. An example measure may be derived from Eqn. 1 and Eqn. 2.

Utilizing the quantified measure from Eqn. 1 and Eqn. 2, a statistical statement may be made regarding the event domain, e.g. identification of a "design envelope" 310, which relates to the safety analysis objective of identifying safety margins for regulatory consideration. A design envelope may be a tolerance region collection of samples, e.g. the tolerance of biases and/or uncertainties of the parameters in the samples, preferably contained within established acceptance criteria. Alternative regions containing the same number of samples may be statistically equivalent.

In an example embodiment the computing device may quantify the biases defining a limiting scenario 318, which may be a model parameter vector. The collection of derived uncertainty models are evaluated, seeking a corresponding minimum or maximum of one or more figures-of-merit, depending on the expectation. The sample, including the parameter's nominal values and biases, closest to the desired criterion is defined as one element in the limiting scenario model parameter vector. In some embodiments, Eqn. 1 may be applied to the limiting scenario to determine the statistic statement of the coverage of the calculation matrix and confidence of the results. Notably, based on Eqn. 2 for a minimum sample size of 59 (m=1) model parameter files, the limiting scenario sample supports an objective statement expression of greater than 95% coverage/95% confidence ($\beta=\gamma=95\%$), but other combinations derived from Eqn. 3 may serve as equally-valued measures.

For addressing nuclear safety regulatory investigation, the collection of the quantified biases that describe a bounding condition for a nuclear power plant prior to a transient or accident may be used by engineers or regulators in determining operating parameters for the system in post processing 316. The computing device may receive one or more acceptance criteria 311, such as a predetermined number of degrees temperature, pounds pressure, or percentages of operating range, or the like. The acceptance criteria 311 may be received from regulators, customers, users, or the like, and is used during post processing 316.

In some example embodiments, the computing device may determine one or more operating parameters for the system based on the limiting scenario 318 model parameter vector and/or the safety margins, for example coolant temperature band or maximum temperature, coolant loop pressure or pressurized pressure band or maximum pressures, safety system set points, such as hot leg temperature rod insertions, power to flow scram limits, pressure relief set points, or the like. The operating parameters may additionally be dependent on operating margins, core life and system life considerations, intended use, or the like.

In some example embodiments, the computing device may determine SSC parameters and uncertainties for construction design based on the assessment judgment 306, design envelope 310, and limiting scenario 318. In that regard, for example, a design envelope may have nominal values and uncertainties associated with the SSCs which have undergone the analysis above with an assessment judgment of excellent or reasonable, and SSC parameter values with nominal variance less than or equal to the uncertainty may be determined for a construction design. In some embodiments in which SSCs may be vender models or specifications, the computing system may select one or more SSCs which include variances within the uncertainty for a construction design.

FIGS. 4-8 illustrate user interface displays according to an example embodiment of the present invention. A user, such as a safety analysis engineer, may access a test input file. The test input file may be imported from a memory, such as storage device 54 or database server 42. The test input may be in the desired format for analysis or may be converted as necessary for analysis. The test input may consist of SSC analytical models and/or uncertainties. In some example embodiments, the test input may be entered using a user interface, such as user interface 60. Error checking rules may be applied to the test input to streamline model development debugging by displaying errors or duplications on the main input model display screen. Error checking rules may include both rules of the simulation engine, such as elevation closure (a requirement for thermal-hydraulic system codes) and rules of practice, such as the identification of input allowed by the simulation engine, but that should be avoided (e.g., volumes with a length-to-diameter ratio of less than 1). Identification of errors may allow the user to correct errors and review model deficiencies before any analysis begins.

Figure 5:
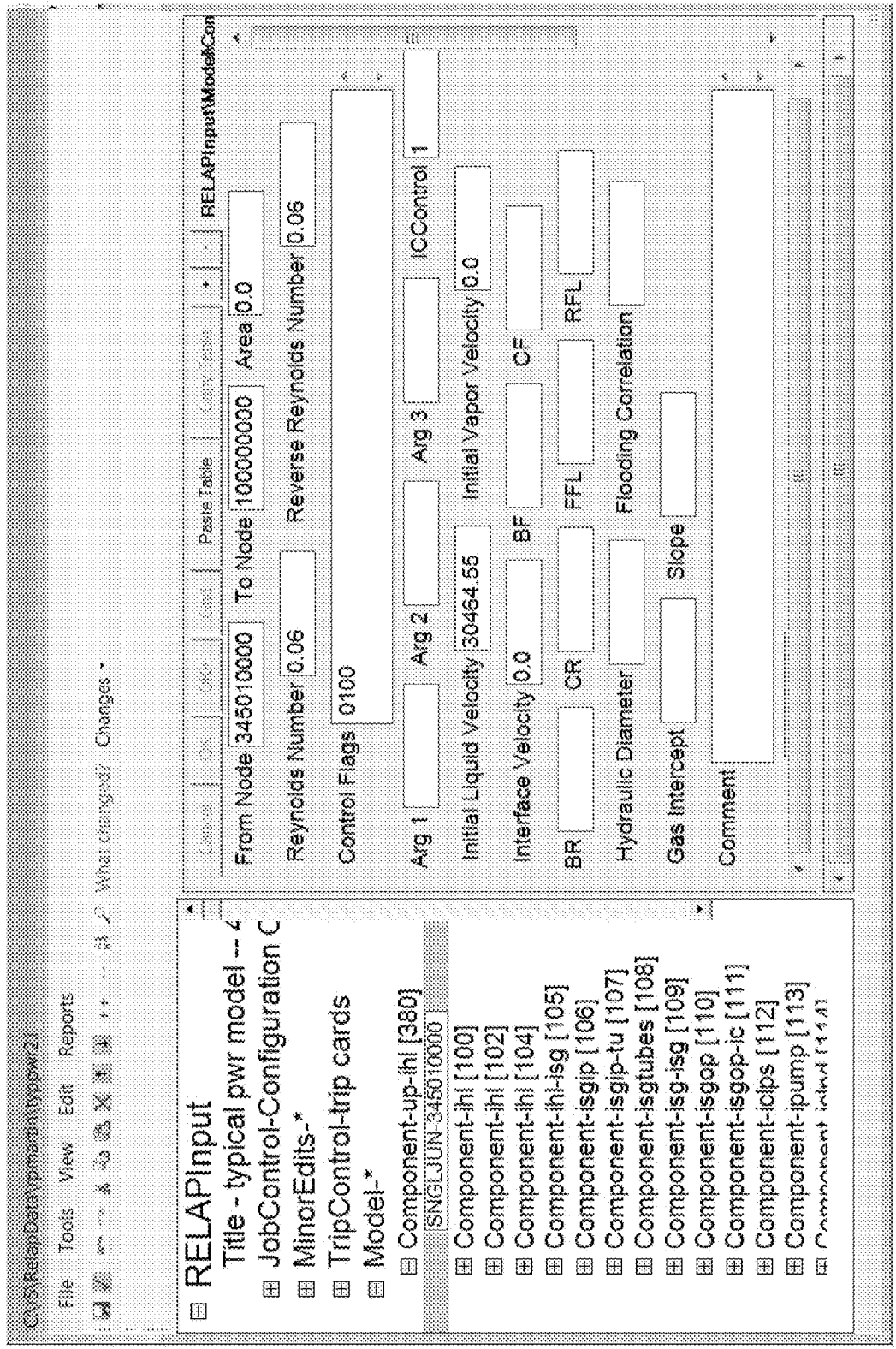

As depicted in FIG. 5, the model parameter database 301 may appear as an outline of the simulation engine input model document on the left side of a graphical user interface (GUI). The outline may be organized to represent categories of input, related to systems, structures, and components associated with the design (and modeling) of a nuclear power plant. Under each item one or more levels of model specification with data entry fields may be provided, appearing on the right-hand side as depicted.

Figure 6:
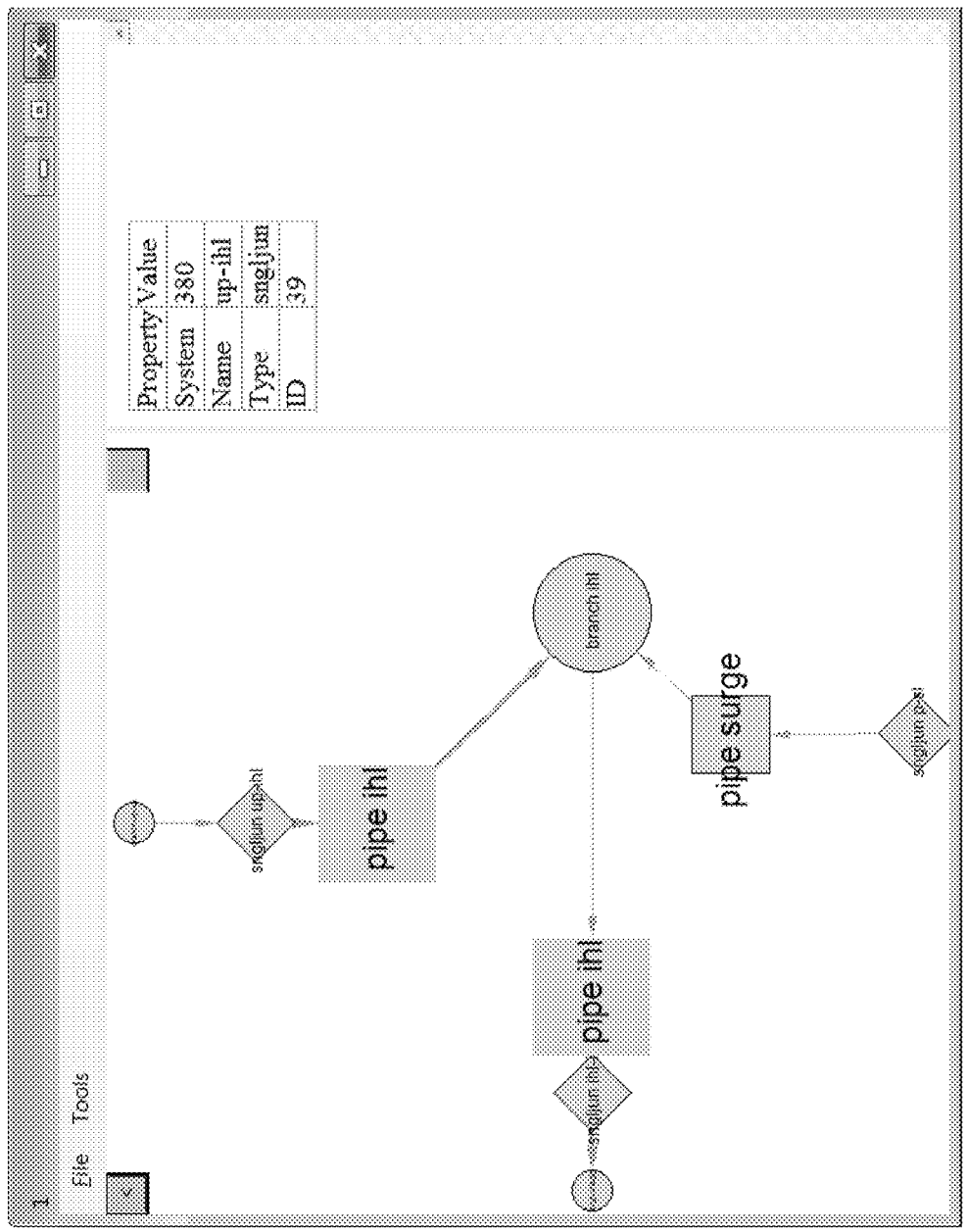
Figure 7:
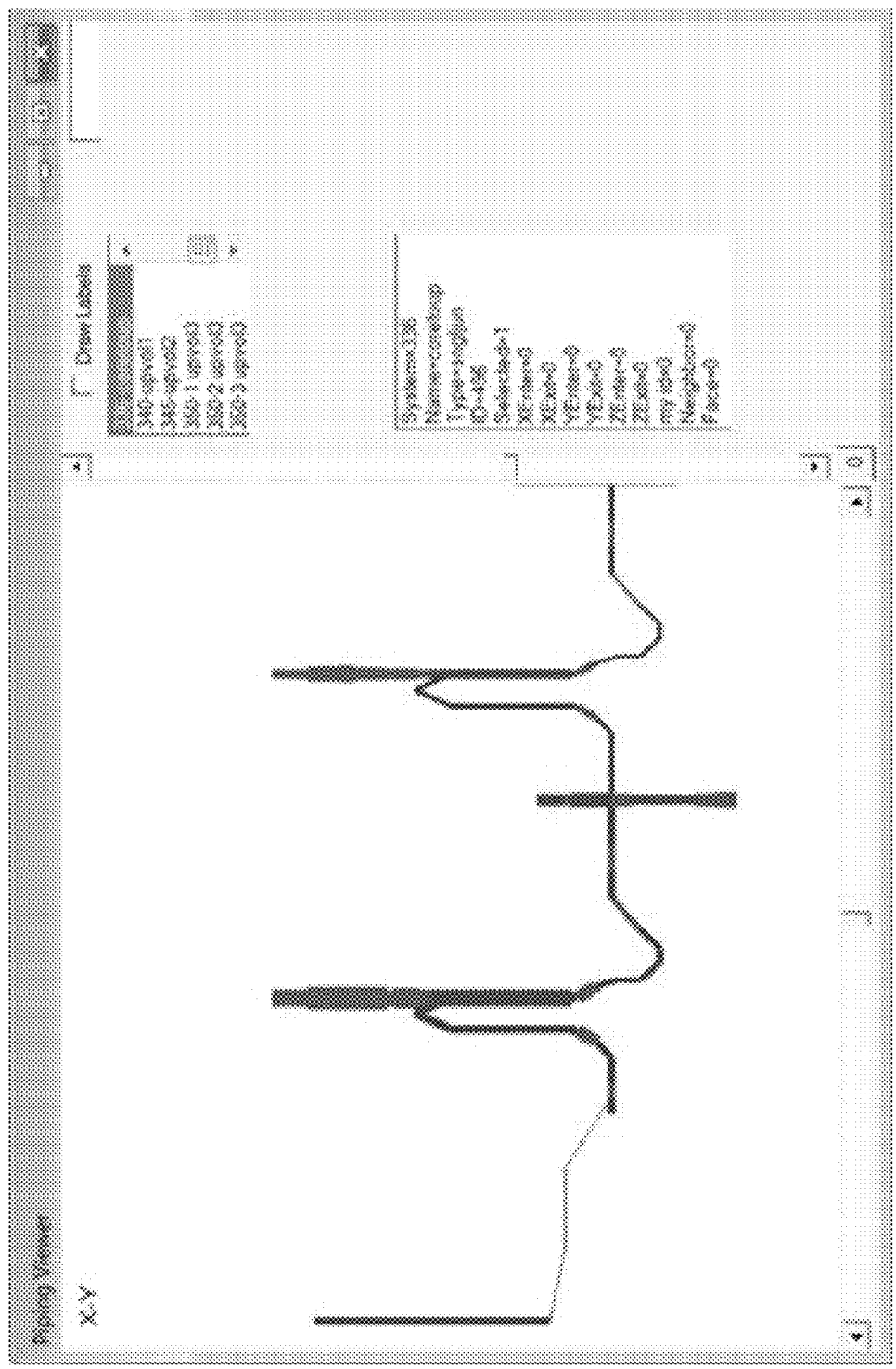

Additionally or alternatively, two other presentation styles, a component diagram and a piping diagram, may be provided to illustrate relationships between model features. In a component diagram, as depicted in FIG. 6, a layout of a component as it relates to other components readily and linearly, such as up to 3 levels from the specified component, may be displayed. In an example embodiment, a user may select a component icon, causing a data form to be presented, expanded on the selected component. In the piping diagram, depicted in FIG. 7, the user may scroll through the model parameters. The control volume, e.g. selected model parameter, may be illustrated by highlighting in a display field and information about the control volume appears in a separate status display field.

Figure 8:
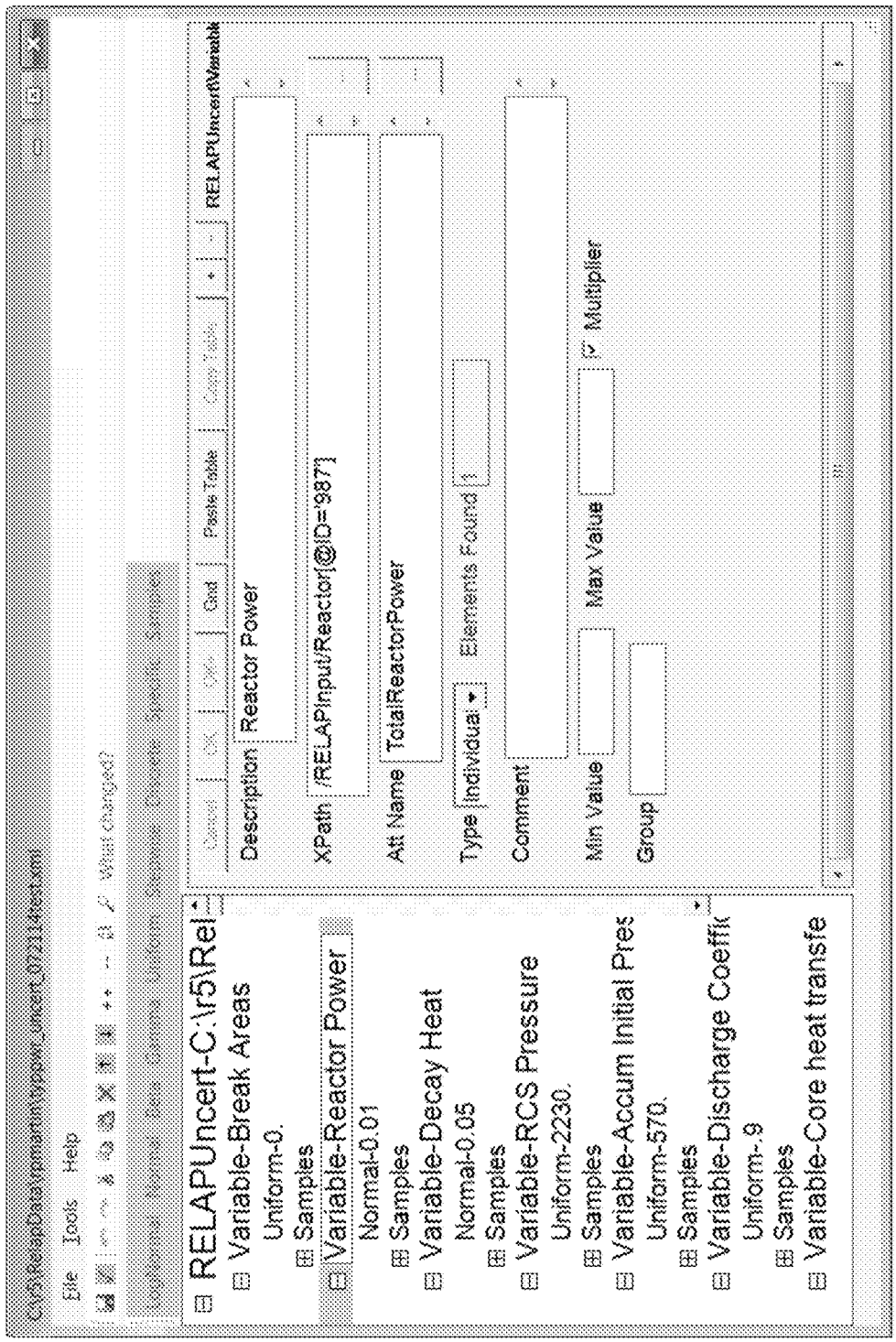

FIG. 8 illustrates a GUI which may be used to support a system safety analysis evaluation, such as calculation matrix 302 and calculation matrix 304 definition.

Limiting conditions as derived by the simulation engine may be visualized for the purpose of preparing documentation for analysis or regulatory review using graphs, scatter plots, or the like. The particular nonparametric approach, discussed above, may provide data populating the figure-of-merit uncertainty domain, which may be illustrated with two-dimensional scatter plots relating the figures-of-merit against model parameter variation. Following the completion of simulation engine calculations, the subsequent output files of the simulation engine may be read and the results presented in reports 320. In addition to graphs and scatter plots, a "sequence of events" table may be generated. The sequence of events table may analyze simulation engine results by rules, such as a rules set appended to the model parameter database 301, to report notable milestones occurring during the course of a simulation. Table 2 presents an example sequence of events table for the Typical PWR test case as might appear in reports 320.

TABLE 2

| Description | Var Name | Comparison | Time | Value |
|---|---|---|---|---|
| Peak Clad Temperature (K) | CNTRLVAR_26 | Max | 232 | 1254.8 |
| Core level (ft) | CNTRLVAR_21 | Min | 102 | 0.044 |
| Containment Pressure (Pa) | P_500010000 | Max | 400 | 130422.8 |
| Peak Clad Temperature (F.) | CNTRLVAR_26 | Max | 232 | 1798.96 |
| Containment Pressure (psia) | P_500010000 | Max | 400 | 18.92 |

Figure 9:
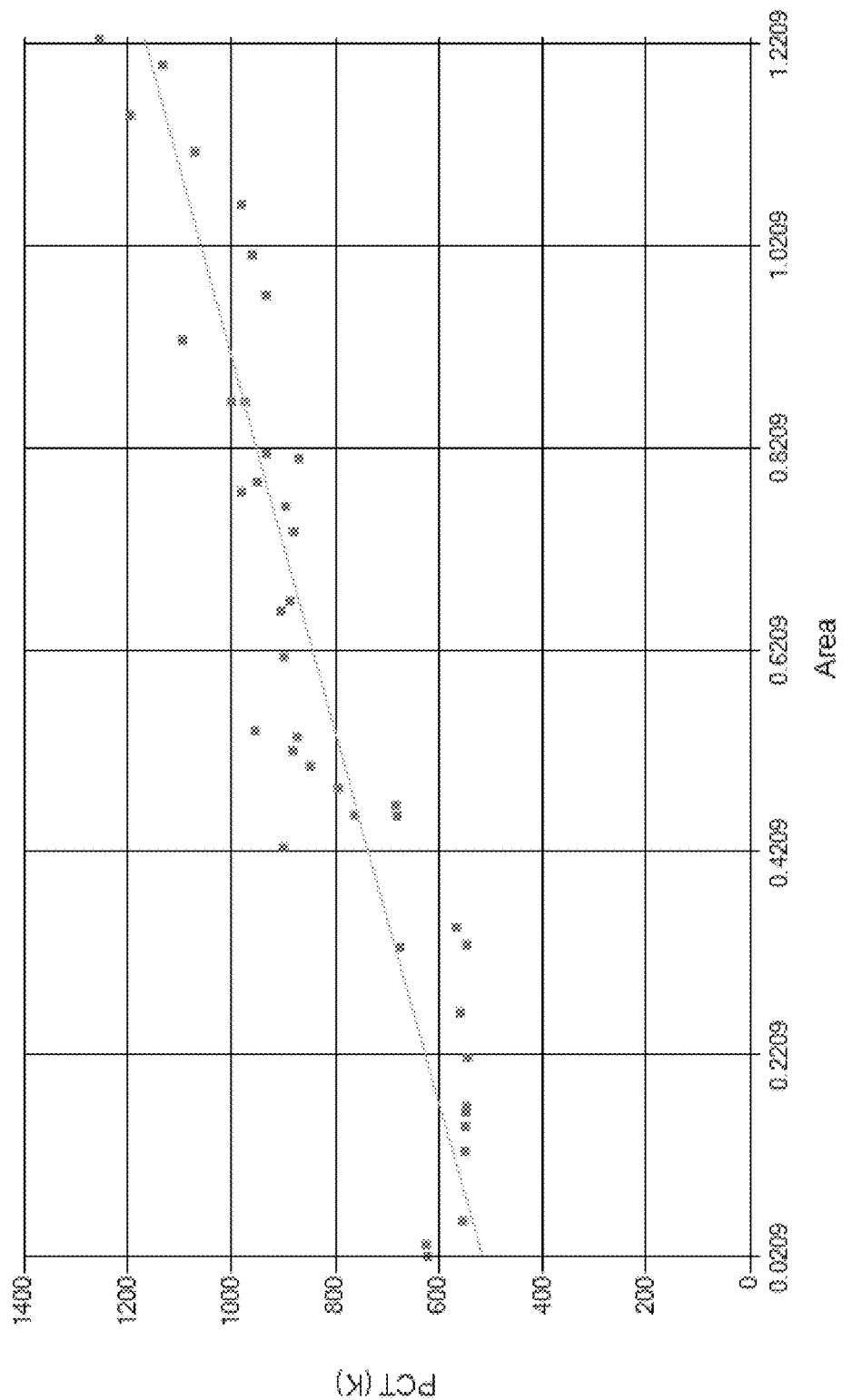
FIG. 9 illustrates a data correlation graph according to an example embodiment.

Continuing the typical pressurized water reactor sample problem, based on convolution analysis results, the correlation and an importance model were characterized relative to the figure-of-merit results and the parametric values. Each correlation may represent an order of magnitude based on the approximate comparisons between the independent variables and the dependent variable. The correlations may be derived at any given time throughout the transient based on a user defined rule. In the typical pressurized water reactor sample problem, strong correlation was identified between peak clad temperature (PCT) and the sampled break area, as depicted in FIG. 9 and as might appear in reports 320. Consequently, the bigger the break size, the higher the resulting PCT due to the inventory lost through the break.

Table 3, as might appear in reports 320, summarizes the complete results from the sample problem importance analyses, built from a convolution analysis, the derivation of uncertainty models 312, and evaluation at >2σ 314. The first entry in this table comprises PCT and the standard deviation of the LOCA calculation samples. After break area, two other important model parameter are identified in order of importance from the stepwise multiple regression exercise. Associated with the model parameter, appearing in the second column, are the sample correlation coefficient between the sampled model parameter and the derived standard deviation estimate of the PCT data relative to that particular model parameter (the square root of Eqn. 14). The sign of the sample correlation is noteworthy in that it indicates whether the model parameter is directly or inversely related to the analysis output measure of interest. In the third column, the limiting scenario parameter bias is drawn from the derived samples reflecting the sample value closest to the limiting condition as evaluated from the derived correlation (i.e., the regression function).

The completeness of this procedure was defined in Eqn. 15. In the Typical pressurized water reactor sample problem, the PCT uncertainty is reported as 201.8 F. The convolution of the identified important parameters from Eqn. 15 is 188.63 F, demonstrating that the combination of the three model parameters provides approximately 93.5% of the influence on the figure-of-merit. These results are shown on separate lines in Table 3.

TABLE 3

Importance results from a 3-Loop Sample Problem

| Uncertainty Contributor | Correlation Coef. (Eqn. 6) | Limiting scenario Parameter Bias | Standard deviation from Contributor (Sqrt (Eqn. 10)) |
|---|---|---|---|
| Max PCT (η = 1798 F.) | NA | | 201.8 |
| Area (ft²) | 0.9258265 | 1.23 | 186.84 |
| Decay Heat | 0.3032328 | 1.07 | 23.124 |
| Initial Accumulator Pressure (psia) | −0.1624085 | 570.4 | 11.802 |
| Convolution of Importance contributors (per Eqn 14) | | | 188.63 |
| Ratio Estimate to Actual (per Eqn. 14/201.8) | | | 0.935 |

Example System Safety Analysis Evaluation Flow Chart

Figure 10:
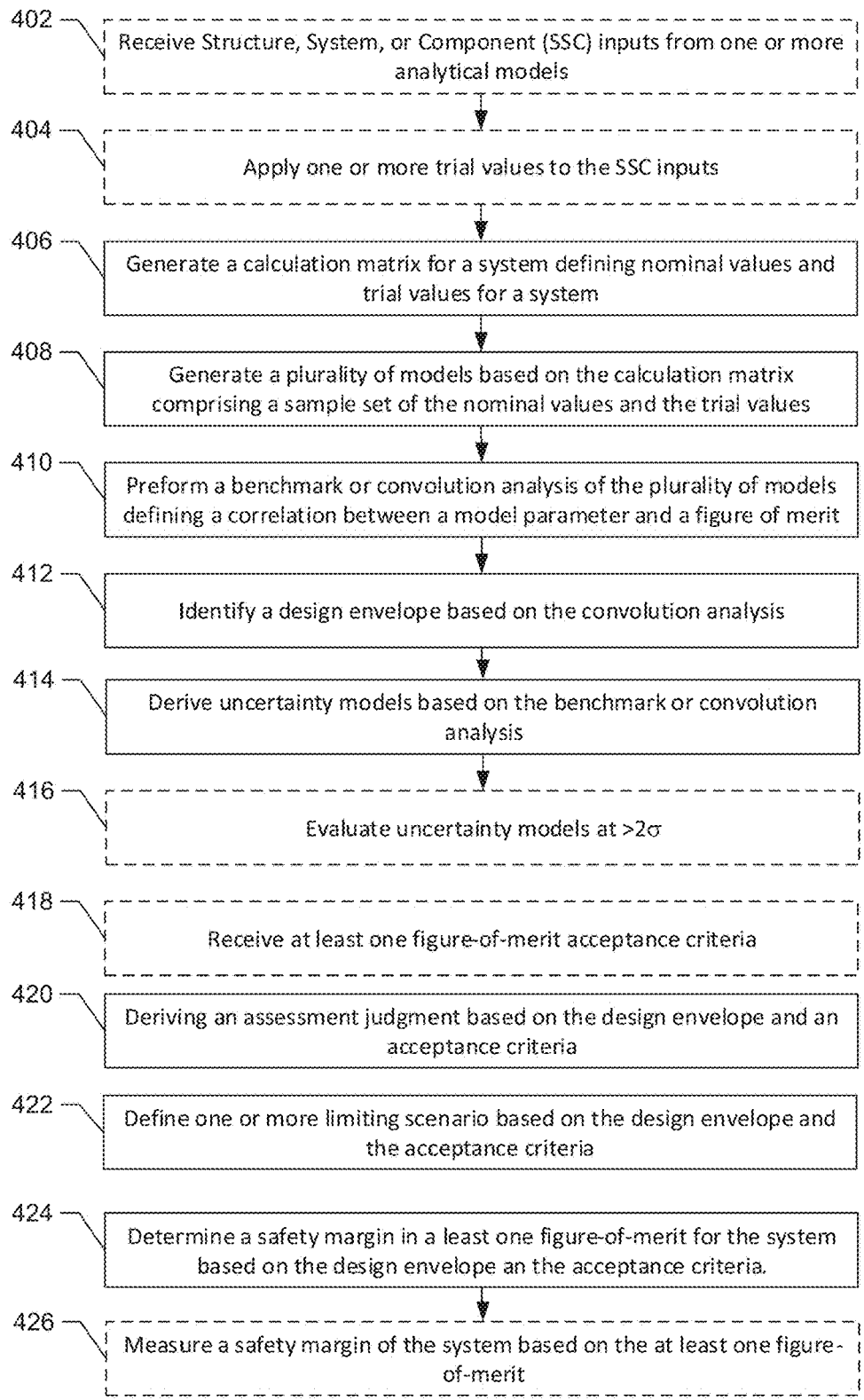
FIG. 10 illustrates a flow chart for system safety analysis evaluation according to an example embodiment.

From a technical perspective, the safety analysis module 44 described above may be used to support some or all of the operations described above. As such, the platform described in FIG. 2 may be used to facilitate the implementation of several computer program and/or network communication based interactions. As an example, FIG. 10 is a flowchart of a method and program product according to an example embodiment of the invention. It will be understood that each block of the flowchart, and combinations of blocks in the flowchart, may be implemented by various means, such as hardware, firmware, processor, circuitry and/or other devices associated with execution of software including one or more computer program instructions. For example, one or more of the procedures described above may be embodied by computer program instructions. In this regard, the computer program instructions which embody the procedures described above may be stored by a memory device of a user terminal (e.g., client 20, application server 40, and/or the like) and executed by a processor in the user terminal. As will be appreciated, any such computer program instructions may be loaded onto a computer or other programmable apparatus (e.g., hardware) to produce a machine, such that the instructions which execute on the computer or other programmable apparatus create means for implementing the functions specified in the flowchart block(s). These computer program instructions may also be stored in a computer-readable memory that may direct a computer or other programmable apparatus to function in a particular manner, such that the instructions stored in the computer-readable memory produce an article of manufacture which implements the functions specified in the flowchart block(s). The computer program instructions may also be loaded onto a computer or other programmable apparatus to cause a series of operations to be performed on the computer or other programmable apparatus to produce a computer-implemented process such that the instructions which execute on the computer or other programmable apparatus implement the functions specified in the flowchart block(s).

Accordingly, blocks of the flowchart support combinations of means for performing the specified functions and combinations of operations for performing the specified functions. It will also be understood that one or more blocks of the flowchart, and combinations of blocks in the flowchart, can be implemented by special purpose hardware-based computer systems which perform the specified functions, or combinations of special purpose hardware and computer instructions.

In this regard, a method according to one embodiment of the invention is shown in FIG. 10. The method may be employed for a system safety analysis evaluation. The method may include, generating a calculation matrix defining nominal values and trial values for a system, at operation 406. The method may also include generating a plurality of models based on the calculation matrix comprising a sample of the nominal values and trial values, at operation 408. At operation 410, the method may include performing a benchmark or convolution analysis of the plurality of models defining a correlation between a model parameter and a figure of merit. The method includes, at operation 412, identifying a design envelope based on the benchmark or convolution analysis, deriving uncertainty models based on the benchmark or convolution analysis, at operation 414, and deriving an assessment judgment based on the design envelope and an acceptance criteria, at operation 420. At operation 422, the method may include, defining one or more limiting scenarios based on the design envelope and an acceptance criteria and at operation 424, determining safety margin for at least one figure-of-merit for the system based on an the design envelope and the acceptance criteria.

In an example embodiment, the method may optionally include, as denoted by the dashed box, operation 402, receiving SSC inputs from one or more analytical models. The method may optionally include, applying one or more trial values to the SSC inputs, at operation 404. At operation 416, the method may optionally include evaluate these uncertainty models at $>2\sigma$. At operation 418, the method may include receiving at least one figure-of-merit acceptance criterion. At operation 426, the method may optionally include measuring the safety margin of the system based on at least one figure-of-merit.

In an example embodiment, an apparatus for performing the method of FIG. 10 above may comprise a processor (e.g., the processor 52) or processing circuitry configured to perform some or each of the operations (402-426) described above. The processor may, for example, be configured to perform the operations (402-426) by performing hardware implemented logical functions, executing stored instructions, or executing algorithms for performing each of the operations. In some embodiments, the processor or processing circuitry may be further configured for additional operations or optional modifications to operations 402-426. In this regard, for example in an example embodiment, the processing circuitry is further configured for receiving structure, system, or component (SSC) inputs from one or more analytical models and applying one or more trial values to the SSC inputs. The generating a calculation matrix is based on the SSC inputs and the trial values. In an example embodiment, wherein the calculation matrix defines sets of nominal values and trial value ranges, wherein the nominal values include the SSC inputs and the trial value ranges include the analytical uncertainty inputs. In some example embodiments, the processing circuitry is further configured to receive at least one figure-of-merit acceptance criteria and wherein the acceptance criteria includes the at least one figure-of-merit acceptance criteria. In some example embodiments, determineing the safety margin is further based on the assessment judgment In an example embodiment, the processing circuitry is further configured for evaluating the uncertainty models at $>2\sigma$. Defining the one or more limiting scenarios is based on the evaluation of these uncertainty models. In some example embodiments, the at least one figure-of-merit is used to measure the system safety margin. In an example embodiment, the system is a thermal or hydraulic system. In an example embodiment, the thermal or hydraulic system is a portion of a nuclear reactor plant.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

In an example embodiment, an apparatus for performing the method of FIG. 10 above may comprise a processor (e.g., the processor 52) or processing circuitry configured to perform some or each of the operations (402-426) described above. The processor may, for example, be configured to perform the operations (402-426) by performing hardware implemented logical functions, executing stored instructions, or executing algorithms for performing each of the operations. In some embodiments, the processor or processing circuitry may be further configured for additional operations or optional modifications to operations 402-426. In this regard, for example in an example embodiment, the processing circuitry is further configured for receiving structure, system, or component (SSC) inputs from one or more analytical models and applying one or more trial values to the SSC inputs. The generating a calculation matrix is based on the SSC inputs and the trial values. In an example embodiment, wherein the calculation matrix defines sets of nominal values and trial value ranges, wherein the nominal values include the SSC inputs and the trial value ranges include the analytical uncertainty inputs. In some example embodiments, the processing circuitry is further configured to receive at least one figure-of-merit acceptance criteria and wherein the acceptance criteria includes the at least one figure-of-merit acceptance criteria. In some example embodiments, determining the safety margin is further based on the assessment judgment. In an example embodiment, the processing circuitry is further configured for evaluating the uncertainty models at $>2\square$. Defining the one or more limiting scenarios is based on the evaluation of these uncertainty models. In some example embodiments, the at least one figure-of-merit is used to measure the system safety margin. In an example embodiment, the system is a thermal or hydraulic system. In an example embodiment, the thermal or hydraulic system is a portion of a nuclear reactor plant.

That which is claimed:

1. An apparatus for system safety analysis evaluation comprising processing circuitry configured for:
   generating a calculation matrix for a safety analysis of a system;
   generating a plurality of models based on the calculation matrix;
   performing a benchmarking or convolution analysis of the plurality of models;
   identifying a design envelope based on the benchmarking or convolution analysis;
   deriving one or more uncertainty models from the benchmarking or convolution analysis;
   deriving an assessment judgment based on the design envelope and an acceptance criteria;
   defining one or more limiting scenarios based on the design envelope; and
   determining a safety margin in at least one figure-of-merit for the system based on the design envelope and the acceptance criteria, wherein determining the safety margin in the at least one figure-of-merit comprises a deterministic analysis.

2. The apparatus for system safety analysis evaluation of claim 1, wherein the processing circuitry is further configured for:
   receiving structure, system, or component (SSC) inputs from one or more analytical models; and
   applying trial values to one or more of the SSC inputs, wherein the generating of a calculation matrix is based on the SSC inputs and the trial values.

3. The apparatus for system safety analysis evaluation of claim 2, wherein the calculation matrix defines sets of nominal values and trial value ranges, wherein the nominal values comprise the SSC inputs and the trial value ranges comprise analytical uncertainty inputs.

4. The apparatus for system safety analysis evaluation of claim 1, wherein the processing circuitry is further configured for:
   receiving at least one figure-of-merit acceptance criteria;
   wherein the acceptance criteria comprises the at least one figure-of-merit acceptance criteria.

5. The apparatus for system safety analysis evaluation of claim 1,
   wherein determining the safety margin in at least one figure-of-merit is further based on the assessment judgment.

6. The apparatus for system safety analysis evaluation of claim 1, wherein the processing circuitry is further configured for:
   evaluating the one or more uncertainty models at $>2G$,
   wherein the defining the one or more limiting scenarios is based on the evaluation of the one or more uncertainty models.

7. The apparatus for system safety analysis evaluation of claim 1, wherein the processing circuitry is further configured for using the at least one figure-of-merit to measure system safety margin.

8. The apparatus for system safety analysis evaluation of claim 6, wherein the system is a thermal or hydraulic system.

9. The apparatus for safety analysis evaluation of claim 8, wherein the thermal or hydraulic system is a portion of a nuclear reactor plant.

10. An apparatus for system safety analysis evaluation comprising processing circuitry configured for:
    generating a calculation matrix defining nominal values and trial values for a safety analysis of a nuclear reactor system;
    generating a plurality of models based on the calculation matrix comprised of sample sets of the nominal values and trial values;
    performing a benchmarking or convolution analysis of the plurality of models that defines a correlation between a model parameter and a figure of merit;
    identifying a design envelope based on the benchmarking or convolution analysis, wherein the design envelope comprises a set of figure-of-merit values correlated to operation of the nuclear reactor system;
    deriving one or more uncertainty models from the benchmarking or convolution analysis;
    deriving an assessment judgment based on the design envelope and an acceptance criteria;
    defining one or more limiting scenarios based on the design envelope; and
    determining a safety margin in at least one figure-of-merit for the nuclear reactor system based on the design envelope and the acceptance criteria, wherein determining the safety margin in the at least one figure-of-merit comprises a deterministic analysis,
    wherein the at least one figure-of-merit is used to measure a safety margin of the nuclear reactor system.

11. The apparatus for system safety analysis evaluation of claim 10, wherein the processing circuitry is further configured for:
    receiving structure, system, or component (SSC) inputs from one or more analytical models; and
    applying trial value ranges to one or more of the SSC inputs,
    wherein the nominal values comprise SSC inputs and the trial value ranges comprise analytical uncertainty inputs.

12. The apparatus for system safety analysis evaluation of claim 10, wherein the processing circuitry is further configured for:
    receiving at least one figure-of-merit acceptance criteria;
    wherein the acceptance criteria comprises the at least one figure-of-merit acceptance criteria.

13. The apparatus for system safety analysis evaluation of claim 10,
    wherein determining the safety margin in at least one figure-of-merit is further based on the assessment judgment.

14. The apparatus for system safety analysis evaluation of claim 10, wherein the processing circuitry is further configured for:
    evaluating the one or more uncertainty models at $>2\sigma$,
    wherein the defining the one or more limiting scenarios is based on the evaluation of the one or more uncertainty models at $>2\sigma$.

15. A method for system safety analysis evaluation comprising:
    generating a calculation matrix for a safety analysis of a system;
    generating a plurality of models based on the calculation matrix;
    performing a benchmarking or convolution analysis of the plurality of models;
    identifying a design envelope based on the benchmarking or convolution analysis;

deriving one or more uncertainty models from the benchmarking or convolution analysis;

deriving an assessment judgment based on the design envelope and an acceptance criteria;

defining one or more limiting scenarios based on the design envelope; and determining a safety margin in at least one figure-of-merit for the system based on the design envelope and the acceptance criteria, wherein determining the safety margin in the at least one figure-of-merit comprises a deterministic analysis.

16. The method for system safety analysis evaluation of claim 15, comprising:

receiving structure, system, or component (SSC) inputs from one or more analytical models; and applying trial values to one or more of the SSC inputs, wherein the step of generating a calculation matrix is based on the one or more SSC inputs and the trial values.

17. The method for system safety analysis evaluation of claim 15 further comprising:

receiving at least one figure-of-merit acceptance criteria;

wherein the acceptance criteria comprises the at least one figure-of-merit acceptance criteria.

18. The method for system safety analysis evaluation of claim 15, wherein the step of determining the safety margin in at least one figure-of-merit is further based on the assessment judgment.

19. The method for system safety analysis evaluation of claim 15, wherein the at least one figure-of-merit is used to measure the safety margin.

20. The method for system safety analysis evaluation of claim 15, wherein the system is a thermal or hydraulic system of a nuclear reactor plant.

* * * * *

UNITED STATES PATENT AND TRADEMARK OFFICE
CERTIFICATE OF CORRECTION

PATENT NO. : 10,990,714 B2
APPLICATION NO. : 14/978931
DATED : April 27, 2021
INVENTOR(S) : Robert P. Martin et al.

Page 1 of 1

It is certified that error appears in the above-identified patent and that said Letters Patent is hereby corrected as shown below:

In the Specification
In Column 1, Line 5, delete "TECHNICAL FIELD" and insert --GOVERNMENT SUPPORT CLAUSE--
In Column 1, Line 40, delete "acceptablility" and insert --acceptability--
In Column 3, Line 49, delete "system" and insert --system.--
In Column 4, Line 20, delete "FIG." and insert --FIGS.--
In Column 11, Line 29, delete "e. g." and insert --e.g.--
In Column 11, Line 29, delete "and or" and insert --and/or--

In Column 15, Line 63, delete " $r_{xy}=[\Sigma(x-\eta_x)(y-\eta_y)]/[\sqrt{(\Sigma(x-\eta x)^2(y-\eta_y)^2)}]$ ," and insert -- $r_{xy}=[\Sigma(x-\eta_x)(y-\eta_y)]/\left[\sqrt{(\Sigma(x-\eta_x)^2(y-\eta_y)^2)}\right]$ --

In Column 17, Line 23, delete " $fct(x_k)=(\vec{x}_k,\vec{x}_0,\Sigma_{i-1}^{k-1}\vec{x}_i)$ ," and insert -- $fct(x_k)=(\vec{x}_k,\vec{x}_0-\Sigma_{i-1}^{k-1}\vec{x}_i)$ --

In Column 21, Line 28, delete "(F.)" and insert --(F)--
In Column 22, Line 15, delete "F.)" and insert --F)--
In Column 22, Line 20, delete "Eqn" and insert --Eqn.--
In Column 23, Line 28, delete "an the" and insert --the--
In Column 23, Line 65, delete "determineing" and insert --determining--
In Column 23, Line 66, delete "judgment" and insert --judgment.--
In Column 24, delete Lines 38-67
In Column 25, delete Lines 1-5

In the Claims
In Column 25, Claim 6, Line 55, delete ">2G," and insert -->2σ,--
In Column 25, Claim 9, Line 65, after "for" insert --system--

Signed and Sealed this
Eighteenth Day of March, 2025

Coke Morgan Stewart
*Acting Director of the United States Patent and Trademark Office*